United States Patent [19]

Wakabayashi et al.

[11] Patent Number: 5,748,316
[45] Date of Patent: May 5, 1998

[54] DETECTOR FOR WAVELENGTH OF EXCIMER LASER

[75] Inventors: Osamu Wakabayashi, Hiratsuka; Yukio Kobayashi, Isehara, both of Japan

[73] Assignee: Komatsu, Ltd., Hiratsuka, Japan

[21] Appl. No.: 637,657
[22] PCT Filed: Oct. 20, 1994
[86] PCT No.: PCT/JP94/01766
§ 371 Date: Apr. 18, 1996
§ 102(e) Date: Apr. 18, 1996
[87] PCT Pub. No.: WO95/11432
PCT Pub. Date: Apr. 27, 1995

[30] Foreign Application Priority Data

Oct. 20, 1993 [JP] Japan .................. 5-265053

[51] Int. Cl.⁶ ........................................ G01B 9/08
[52] U.S. Cl. ................................ 356/352; 372/32
[58] Field of Search .................. 356/352; 372/29, 372/32; 315/307, 248

[56] References Cited

U.S. PATENT DOCUMENTS

| | | | |
|---|---|---|---|
| 4,173,422 | 11/1979 | Synder | 356/352 |
| 4,482,842 | 11/1984 | Fujimura et al. | 313/634 |
| 4,648,951 | 3/1987 | Maya | 204/157.21 |
| 4,986,665 | 1/1991 | Yamanishi et al. | 356/402 |
| 5,173,642 | 12/1992 | Matsumoto et al. | 315/209 |
| 5,198,872 | 3/1993 | Wakabayashi et al. | 356/352 |
| 5,218,421 | 6/1993 | Wakabayashi et al. | 356/352 |
| 5,381,076 | 1/1995 | Narone | 356/352 |
| 5,387,974 | 2/1995 | Nakatani | 315/209 |

*Primary Examiner*—David C. Nelms
*Assistant Examiner*—Zandra V. Smith
*Attorney, Agent, or Firm*—Greer, Burns & Crain, Ltd.

[57] ABSTRACT

A low-pressure mercury lamp is used as a reference light source, and stable reference light is produced by using 253.7 nm line emitted by the lamp in which 49% or more of specific isotopic mercury is sealed.

13 Claims, 20 Drawing Sheets

DETECTOR FOR WAVELENGTH OF EXCIMER LASER

TECHNICAL FIELD

This invention relates to a device for detecting the wavelength of a narrow-band excimer laser which is used as a light source for a semiconductor exposure apparatus.

BACKGROUND ART

Conventionally, a monitor etalon is used for the purpose of detecting narrow-band excimer laser wavelength linewidths and wavelengths. A monitor etalon is constituted by using an air-gap etalon in which partially reflecting mirrors are mounted facing each other with a prescribed interval between them, so the transmission wavelength $\lambda$ of this air-gap etalon can be represented as follows.

$$m\lambda = 2nd \cdot \cos\theta \tag{1}$$

m: integer
d: gap between etalon and partially reflecting mirrors
n: refractive index of partially reflecting mirrors
$\theta$: angle defined by incident light and the normal to the etalon.

It is seen from this equation that, if n, d and m are constant, $\theta$ changes when the wavelength $\lambda$ changes. In a monitor etalon, this property is used to detect the wavelength of light that is the object of detection.

However, in the abovementioned monitor etalon, if the pressure in the air gap and the ambient temperature changes, the angle $\theta$ changes, even if the wavelength is constant. Because of this, there are occasions when it is not possible to detect the wavelength $\lambda$ accurately on the basis of the angle $\theta$. When using a conventional monitor etalon, therefore, it is common practice to perform wavelength detection while controlling the pressure in the air gap and the ambient temperature, etc. to hold them constant.

However, it is difficult to effect highly precise control of the pressure in the air gap and the ambient temperature, and it is therefore not possible to detect absolute wavelengths with satisfactory precision.

There has therefore been proposed a device in which a reference light (eg, mercury lamp light rays) whose wavelength has been determined beforehand is made incident on a monitor etalon together with the light that is the object of detection (output laser light), and the absolute wavelength of the light that is the object of detection is detected with good precision by detecting the relative wavelength of this light with reference to the reference light (eg, the disclosures of Japanese Patent Application Laid-open Nos. 1-101683 and 4-356987).

In a device such as this, light transmitted by the monitor etalon is introduced directly into a light detector such as a CCD image sensor, etc., an interference fringe is formed on the detection surface of this light detector, and the absolute wavelength is detected on the basis of the position of the interference fringe.

However, even in the prior art, if the spectral waveform of the reference light source becomes distorted or changes because of changes in time or the temperature of the reference light source (the spectral waveform changes considerably because of self-absorption of a mercury lamp's 253.7 nm line), there is a resulting distortion of the light intensity distribution of the interference fringe produced by the monitor etalon. In this case, because of the change in the reference light wavelength, it was impossible to highly accurately specify the absolute wavelength of the light to be detected.

There is therefore a demand for a technique whereby reference light which is stable in terms of wavelength changes can be produced, and for a technique for highly precise measurement of the absolute wavelength of reference light.

With the foregoing in view, it is an object of the present invention to provide an excimer laser wavelength detection device with which a stable reference light can be produced and highly precise measurements of the absolute wavelengths of the reference light and of light which is the object of detection can be made.

DISCLOSURE OF THE INVENTION

In the first embodiment of the present invention, a low-pressure mercury lamp is used as a reference light source, and this low-pressure mercury lamp is made such that not less than 49% of a specific isotopic mercury is sealed therein and 253.7 nm line is used, whereby reference light whose spectral wavelength is clear and whose linewidth is narrow is produced.

In the second embodiment of the present invention, a low-pressure mercury lamp is used as a reference light source, and the surface temperature of this low-pressure mercury lamp is controlled so as to not exceed a set temperature (eg, 40° C.) so that a clear, easily detectable spectral waveform is produced, and so that the absolute wavelength of the reference light always coincides with the theoretical value, so that reference light wavelength compensation calculations can be omitted.

In the third embodiment of the present invention, a low-pressure mercury lamp is used as a reference light source, and this low-pressure mercury lamp is a hot cathode type. This gives the following advantages.

1. Light is emitted at a low voltage (about 30 V), and there is no need for a special power supply.

2. Lighting occurs instantaneously when current is caused to flow, and the light emission stabilizes instantaneously.

3. Since the light emission temperature is low, the spectral waveform is clear, and the linewidth is narrow not more than 1 pm).

4. It is inexpensive.

5. There is no deterioration because of switch-on/switch-off.

The fourth embodiment of the present invention, is an excimer laser waveform detection device in which reference light produced by a reference light source and laser oscillation light are made incident on a wavelength detector. The absolute wavelength of the oscillation light is detected from the detection output of the wavelength detector. The excimer laser waveform detection device is provided temperature detection means for detecting the surface temperature of the reference light source, memory means in which relations between the absolute wavelength of the reference light and the surface temperature of the reference light source are preset, and oscillation light wavelength calculation means for reading from the memory means the reference light absolute wavelength corresponding to a temperature detected by the temperature detection means and for determining the absolute wavelength of the oscillation light on the basis of the reference light absolute wavelength that has been read and the output of the wavelength detector.

According to this invention, the relationship between the reference light absolute wavelength and the surface temperature of the reference light source are determined and stored in advance, and a reference light absolute wavelength corresponding to the current reference light source surface temperature is obtained. Then, the absolute wavelength of oscillation light is determined from this reference light absolute wavelength and the output of the wavelength detector.

According to this embodiment of the present invention it is still possible to precisely determine the absolute wavelength of the reference light, even if the temperature of the reference light is not controlled to a constant temperature.

In the fifth invention, in an excimer laser wavelength detection device in which a low-pressure mercury lamp is used as a reference light source, reference light emitted by this reference light source and laser oscillation light are made incident on a wavelength detector, and the absolute wavelength of the oscillation light is detected on the basis of the detection output of this wavelength detector, there is provided memory means for storing the spectral waveforms of mercury isotopes that are sealed in the low-pressure mercury lamp, waveform synthesis means for determining the spectral waveform of the reference light emitted by the low-pressure mercury lamp, by combining the spectral waveforms of the mercury isotopes sealed in the low-pressure mercury lamp in accordance with the mercury isotope mixture ratio, and waveform calculation means for determining the absolute wavelength of the reference light from this reference light spectral waveform and for calculating the absolute wavelength of the laser oscillation light on the basis of the reference light absolute wavelength that has been determined.

With this invention, since the spectral wavelength of the reference light emitted by a low-pressure mercury lamp is determined in accordance with the spectral wavelengths of mercury isotopes that are sealed in the low-pressure mercury lamp and their mixture ratio, and the absolute wavelength of the reference light is determined from the resulting composite spectral wavelength, there is no need for a structure for measuring the absolute wavelength of the reference light.

In the sixth invention, in an excimer laser wavelength detection device in which a low-pressure mercury lamp is used as a reference light source, reference light emitted by this reference light source and laser oscillation light are made incident on a wavelength detector, and the absolute wavelength of the oscillation light is detected on the basis of the detection output of this wavelength detector, an electrodeless discharge unit or a cold cathode unit is employed as the low-pressure mercury lamp, and there is provided power supply control means by which the low-pressure mercury lamp is first lit by causing a power supply to act on it with high energy, and, when lighting thereof is confirmed, the energy supplied by the power supply is lowered, producing reference light with a narrow spectral linewidth.

In the seventh invention, in an excimer laser wavelength in which a low-pressure mercury lamp is used as a reference light source, reference light emitted by this reference light source and laser oscillation light are made incident, via wavelength selection elements, on a light detection element array in which a plurality of light detection elements are arrayed, and the absolute wavelength of the oscillation light is determined on the basis of the detection outputs of the light detection elements in this light detection element array, there is provided spectral waveform approximation calculation means for calculating approximate waveforms for the spectral waveforms of the reference light and the laser oscillation light by applying a prescribed approximation process to the detection outputs of the light detection elements of the light detection array, for calculating from these approximate spectral waveforms the radii of the reference light and the laser oscillation light interference fringes, and for calculating the absolute wavelength of the laser oscillation light from the interference fringe radii that have been determined.

Thus, in this invention, spectral waveform approximation calculation means is provided for calculating approximate waveforms for the spectral waveforms of the reference light and laser oscillation light, these approximate spectral waveforms are used to calculate the radii of the reference light and the laser oscillation light interference fringes, and the interference fringe radii are used to determine the absolute wavelength of the laser oscillation light, so that it is possible to obtain spectral waveforms with high resolution, and calculations in this process can be speeded up.

BEST MODE FOR CARRYING OUT THE INVENTION

The invention will now be described in detail with reference to the embodiments depicted in the attached drawings.

Figure 1:
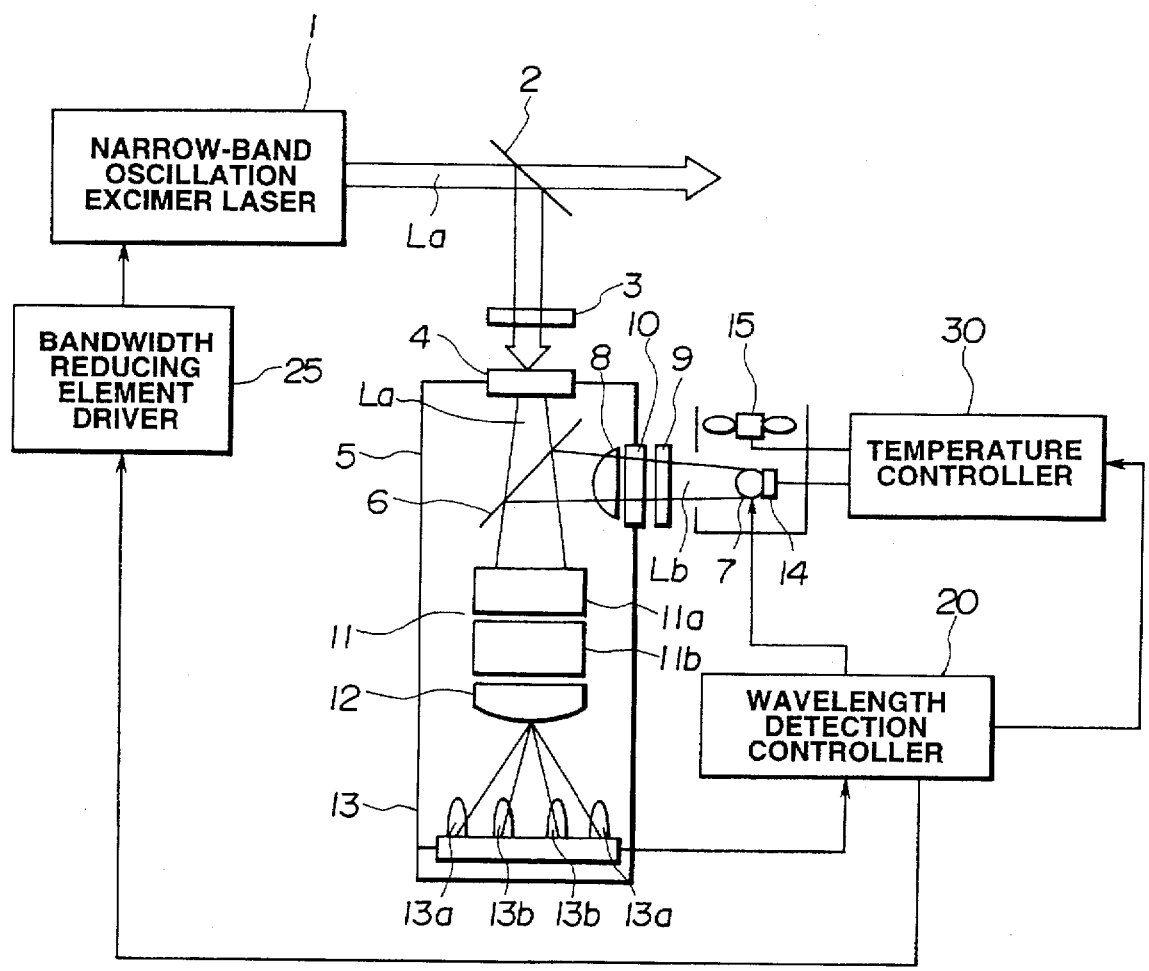
FIG. 1 is a block diagram of an embodiment of the invention.

FIG. 1 shows one example of an excimer laser wavelength control unit.

A portion of laser light La from a narrow-band oscillation excimer laser 1 whose bandwidth has been narrowed is reflected by a beam splitter 2 and is directed as sampling light onto a shutter 3, and, when the shutter 3 is open, it passes through frosted glass 4 and falls on a beam splitter 6 in a wavelength detector 5.

A low-pressure mercury lamp 7 for producing reference light Lb is installed in a position that is approximately coincident with that of the focal point of a condensing lens 8, and, whereby the interference fringe light quantity is increased by the reference light. When a shutter 9 is open, the reference light Lb emitted by the low-pressure mercury lamp 7 is input into a bandpass filter 10, which selects only the 253.7 nm wavelength line. The selected reference light is passed through the condensing lens 8 and directed onto the beam splitter 6.

The wavelength detector 5 consists of the beam splitter 6, a monitor etalon 11, a condensing lens 12 and a light position detector 13.

The monitor etalon 11 comprises two transparent plates 11a and 11b whose inner surfaces are partially reflecting mirrors, and it serves to change the transmitted wavelength in accordance with the angle of light incident on the etalon.

Light which passes through the etalon 11 is directed onto the condensing lens 12. This condensing lens 12 is, eg; an achromatic lens for which color aberration correction of the wavelengths of both the detected light and the reference light has been effected, and interference fringes of these two forms of light is produced at the location of the focal point of this achromatic lens. A concave mirror may be used as this condensing lens 12.

The light position detector 13 is, eg; a unidimensional or a two-dimensional image sensor that is located on the focal plane of the condensing lens 12, light which has passed through the condensing lens 12 forms an image on the light position detector 13, and a first interference fringe 13a corresponding to the wavelength of the detected light La and a second interference fringe 13b corresponding to the wavelength of the reference light Lb are formed on the detection plane of the light position detector 13. Signals corresponding to the positions of these first and second interference fringes are output from the light position detector 13 to a wavelength detection controller 20.

In the wavelength detection controller 20, the relative wavelength of the detected light La with respect to the reference light Lb is calculated from these interference fringe position signals and light intensity signals. The wavelength detection controller 20 also calculates the deviation between a prescribed wavelength and the detected absolute wavelength, and it controls a band-narrowing element driver 25 in a manner such as to cause the selected wavelength of a wavelength selection element to be changed by an amount corresponding to this deviation.

In this case, a temperature sensor 14 and a cooling fan 15 are mounted on low-pressure mercury lamp 7, and the temperature of the low-pressure mercury lamp 7 are controlled to a prescribed temperature by a temperature controller 30.

First, the isotope purity in the low-pressure mercury lamp 7 which is used as a reference light source in this setup will be considered. It is taken that the 253.7 nm line is used as the reference light in this low-pressure mercury lamp 7.

Figure 2:
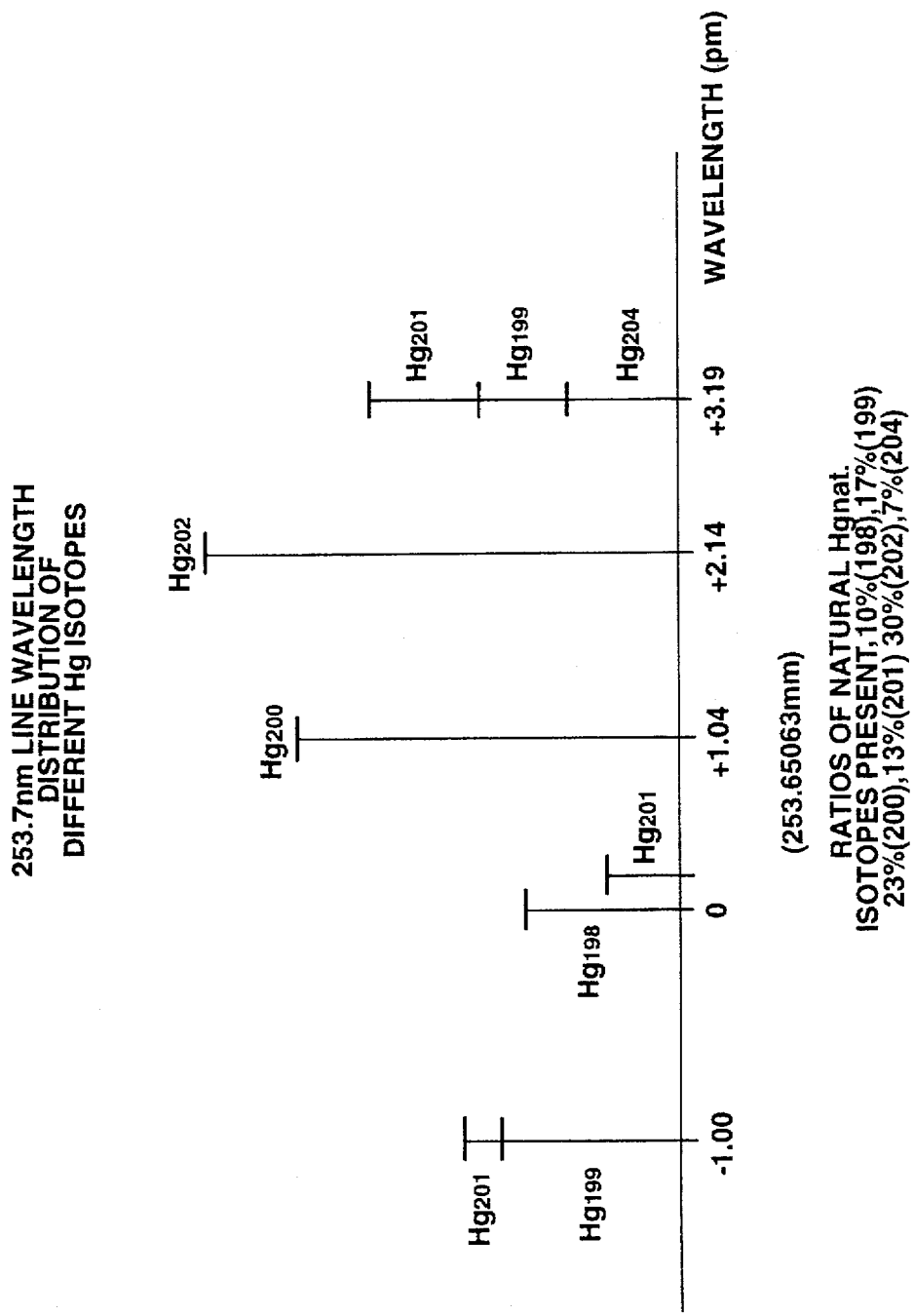
FIG. 2 is a diagram showing the 253.7 nm line wavelength distribution of different Hg isotopes.

FIG. 2 shows the 253.7 nm absolute wavelengths corresponding to mercury isotopes and their relative light intensities. The ratios in which the isotopes of natural mercury Hgnat are present are 10% (198Hg), 17% (199Hg), 23% (200Hg), 13% (201Hg), 30% (202Hg) and 7% (204Hg). Thus, the natural mercury Hgnat 253.7 nm line is the result of superimposition of 5 emission lines. "201Hg" refers to mercury with a mass number of 201.

Figure 3A:
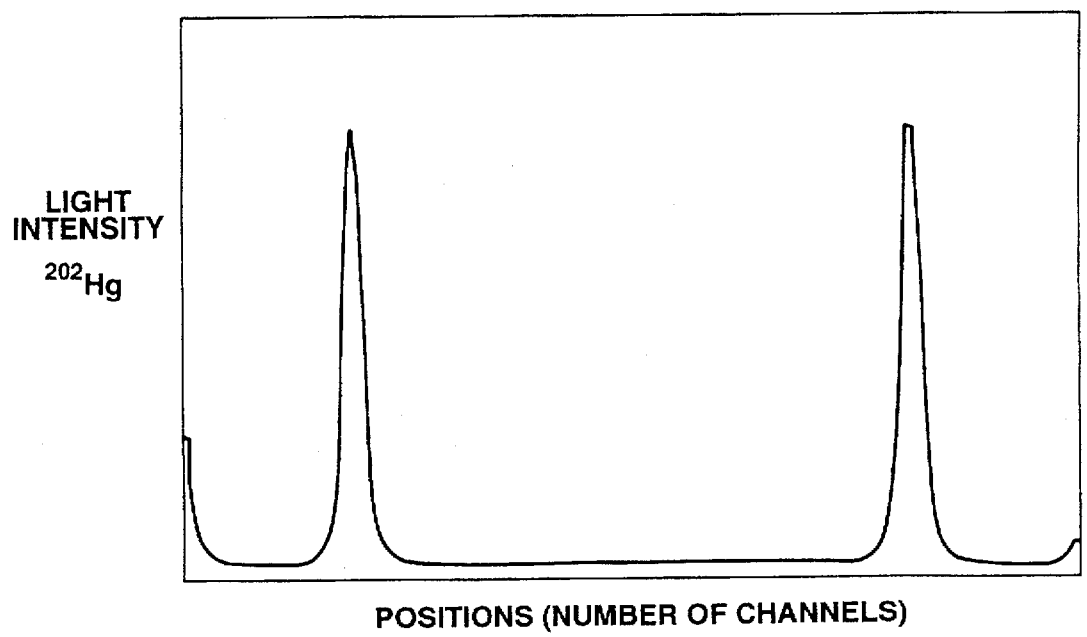
FIGS. 3(a) and 3(b) are diagrams showing the spectral waveforms of 202Hg and natural mercury.
Figure 3B:
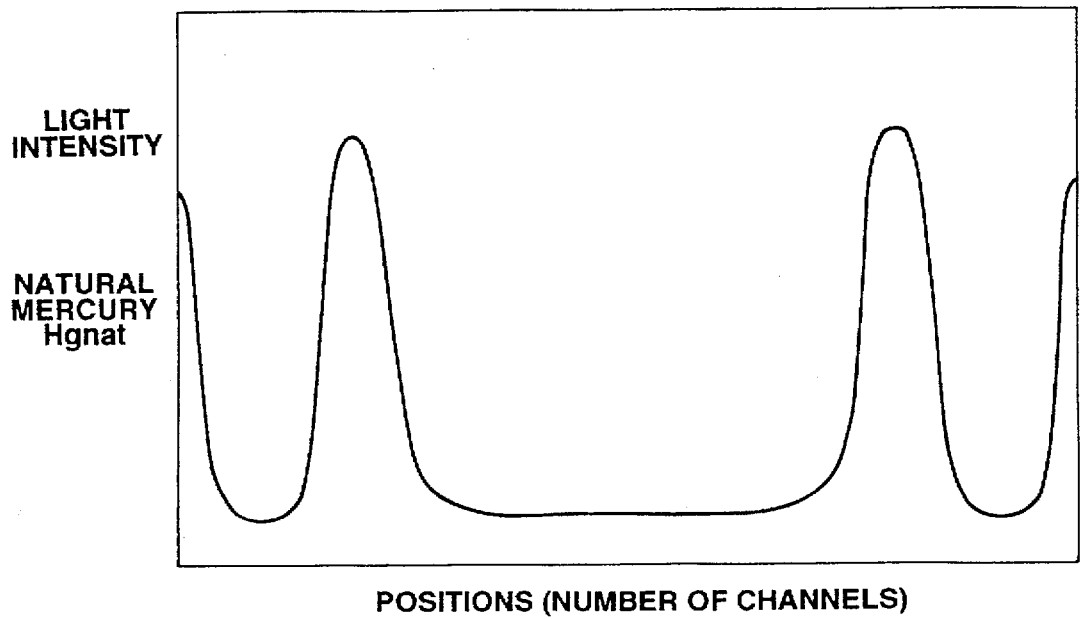

FIGS. 3(a) and 3(b) show interference fringes in the case where only 202Hg is sealed in the low-pressure mercury lamp 7 (3(a)), and the case where natural mercury Hgnat is sealed in (3(b)). The arrangement in these cases employs a monitor etalon 11 whose free spectral range (FSR)=20 pm.

Comparing the interference fringes, in the case of natural mercury Hgnat shown in FIG. 3(b), it is difficult to specify the absolute wavelength of the reference light, since the width of the interference fringe has a large value of about 6 pm. In contrast, the shape of the interference fringe in the case of the 202Hg isotope is very clear, and the measured linewidth is very narrow, (about 1.5 pm) so, from FIG. 2 the absolute wavelength of the reference light can be specified as being 253.65277 nm (253.56063+0.00214).

Figure 4A:
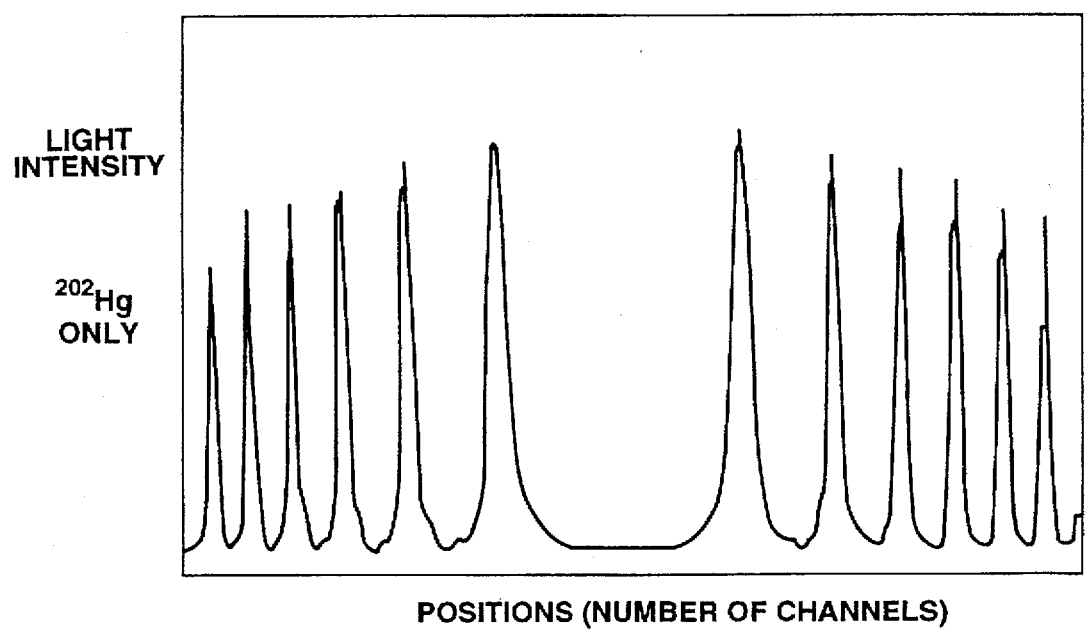
FIGS. 4(a) and 4(b) are diagrams showing the spectral waveforms of 202Hg and natural mercury.
Figure 4B:
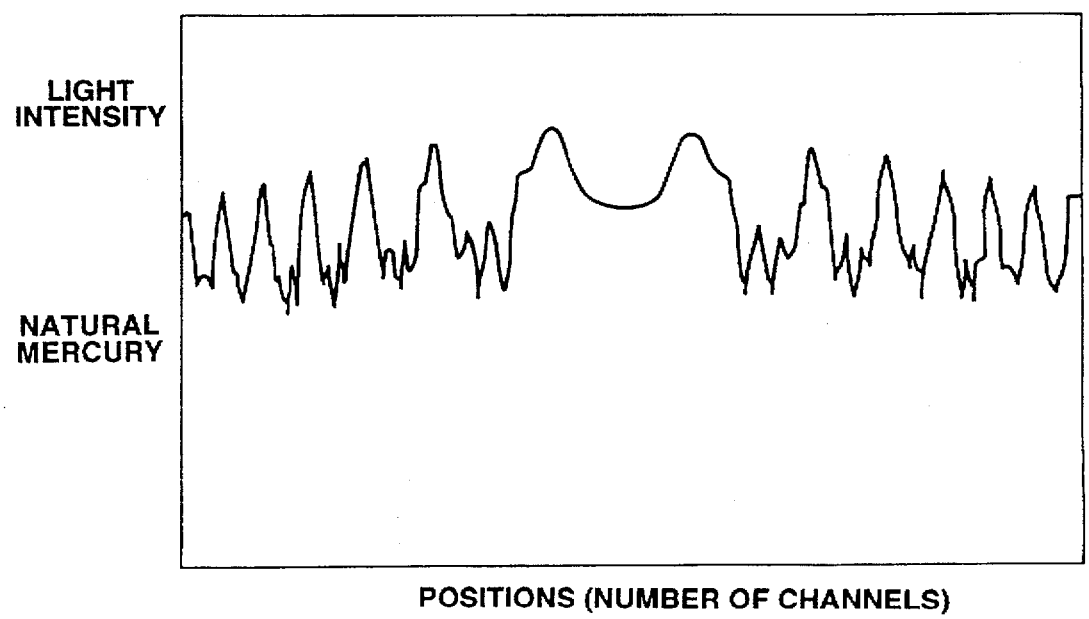
Figure 5A:
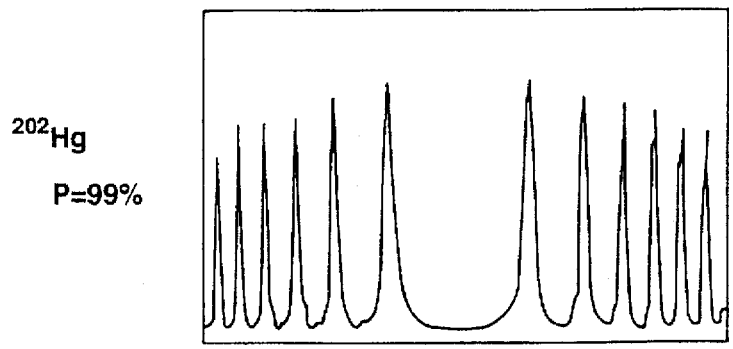
FIGS. 5(a) to 5(d) are diagrams showing spectral waveforms corresponding to different 202Hg mixture ratios.
Figure 5B:
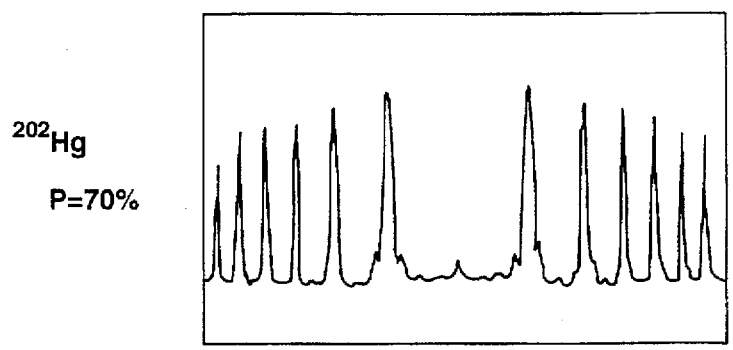
Figure 5C:
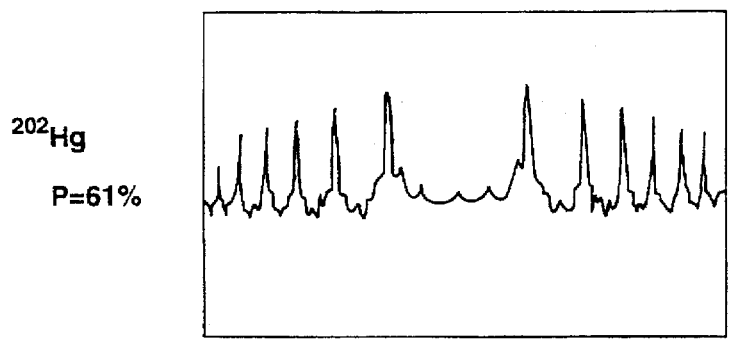
Figure 5D:
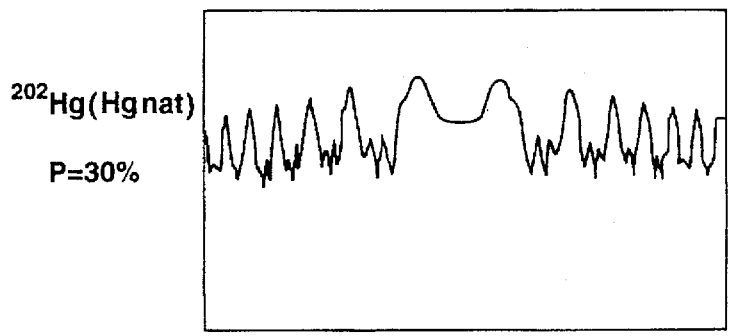

FIGS. 4(a) and 4(b) show interference fringes in the case in which only 202Hg is sealed in the low-pressure mercury lamp 7 (4(a)), and in the case where natural mercury Hgnat is sealed in (4(b)). In these cases, a monitor etalon whose free spectral range (FSR)=5 pm is used.

Comparing the interference fringes, it is difficult to identify the absolute wavelength of the reference light, since there is very little contrast in the interference fringe for natural mercury in FIG. 4(b). In contrast, the shape of the interference fringe with only the 202Hg isotope shown in FIG. 4(a) is very clear, and the measured linewidth is very narrow, (about 1.0 pm) so, from FIG. 1, it is possible to identify the reference light 202Hg as being 253.65277 nm.

The resolution R of the etalon is represented by the following equation.

$$R = FSR/F \qquad (2)$$

F: etalon's fineness

FSR: free spectral range

F is determined by the etalon's surface precision, reflectance and parallelism, and, normally, in the vicinity of 248 nm, it is about 30 at most.

In other words, if the resolution of the monitor etalon is to be improved, it is necessary to make the FSR smaller, and in this case, therefore, it is better to seal isotopes in the low-pressure mercury lamp 7, as indicated in FIGS. 4(a) and 4(b).

FIGS. 5(a) to 5(d) show the interference fringes when the purity of isotopic mercury 202Hg in a low-pressure mercury lamp 7 is 99%, 70%, 61% and 30%. The interference fringe contrast improves as the purity P increases. When P=61%, there is a marked decrease in the contrast, but it is still possible to identify the absolute wavelength of the reference light, since sharp peaks due to 202Hg can be detected.

Figure 6:
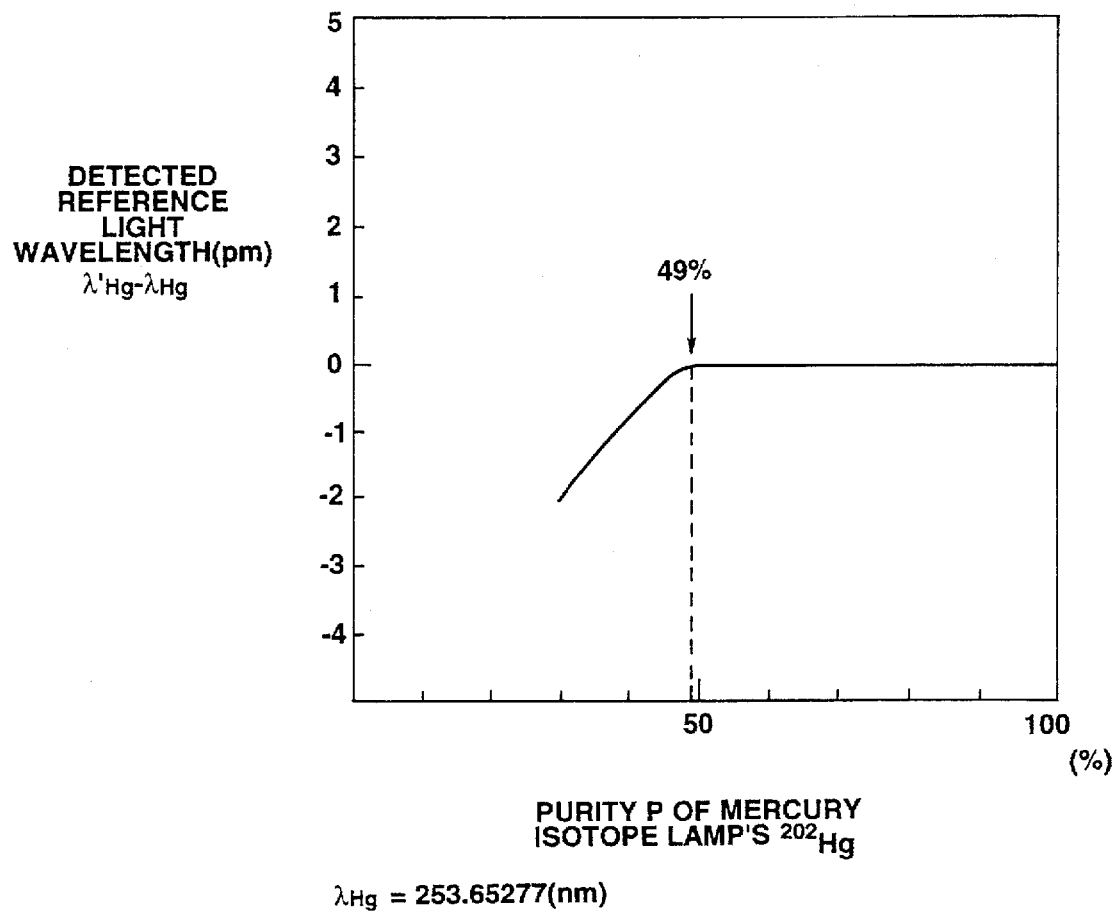
FIG. 6 is a diagram showing the relation between the wavelength of reference light and the purity of specific mercury.

FIG. 6 shows the relationship between the isotope's purity P and the difference between the absolute wavelength λ Hg' of the reference light (253.7 nm line) that is detected and the theoretical absolute wavelength λ Hg. According to FIG. 6, this difference becomes practically 0 when P=49% or more. Further, when P≧49%, sharp peaks due to the isotope can be detected, as seen in FIG. 5 earlier. Therefore, if the purity P of a specific isotope is 49% or more, the detected reference light wavelength does not deviate from the theoretical value, so the theoretical value can be used without modification.

Thus, since reference light with a clear spectral waveform and a narrow linewidth can be produced by sealing a specific (single type of) mercury isotope at more than a prescribed purity in the lamp, it can be used as reference light even for high-resolution monitor etalon with a small FSR. Consequently, highly precise detection of the absolute wavelength of light to be detected is possible.

Next, the temperature of a low-pressure mercury lamp will be considered.

Figure 7A:
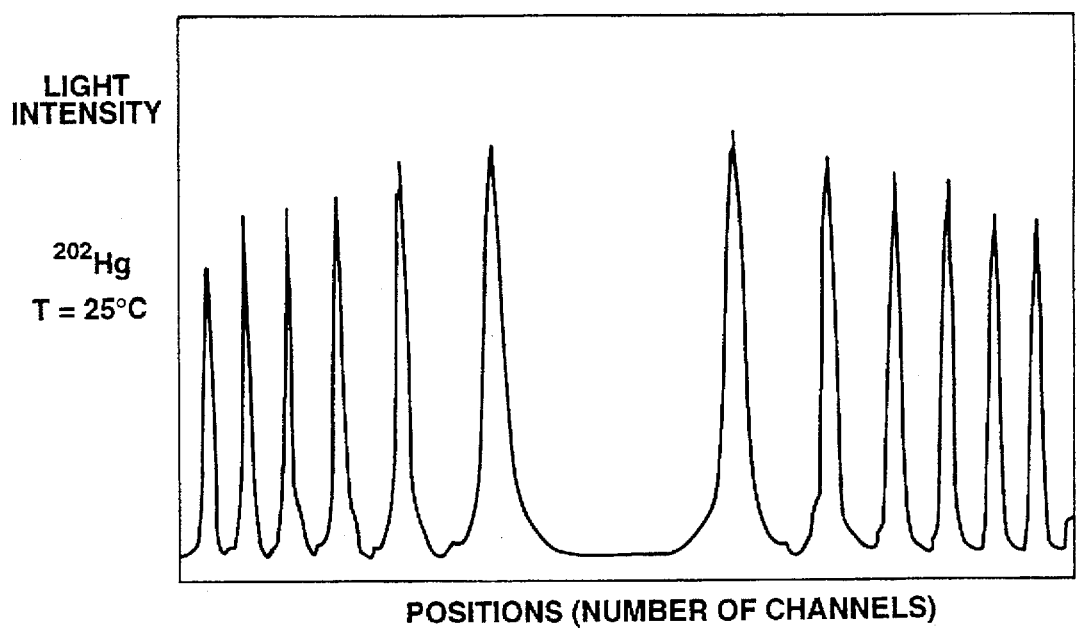
FIGS. 7(a) and 7(b) are diagrams showing 202Hg spectral waveforms in corresponding to temperature.
Figure 7B:
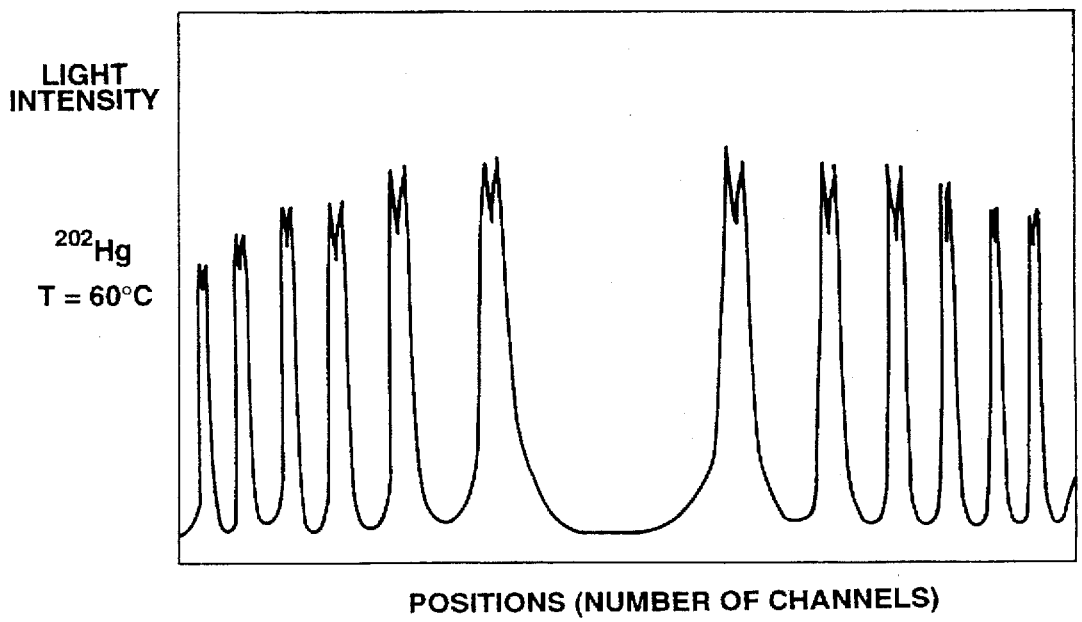

FIGS. 7(a) and 7(b) show the interference fringes when, in the case of 202Hg, the temperature T of the glass surface of a low-pressure mercury lamp 7 is 20° C. and 60° C. (time elapses after lighting). When the temperature T=25° C. there is a very clear waveform, but when T=60°, self-absorption occurs, and the central portions of the interference fringe peaks become sunken. Interference fringe waveforms such as temperature-dependent in highly reproducible fashion, and the result is that at each temperature T there is a corresponding shape. In other words, if the temperature is constant, the form of the interference fringe is constant.

Figure 8:
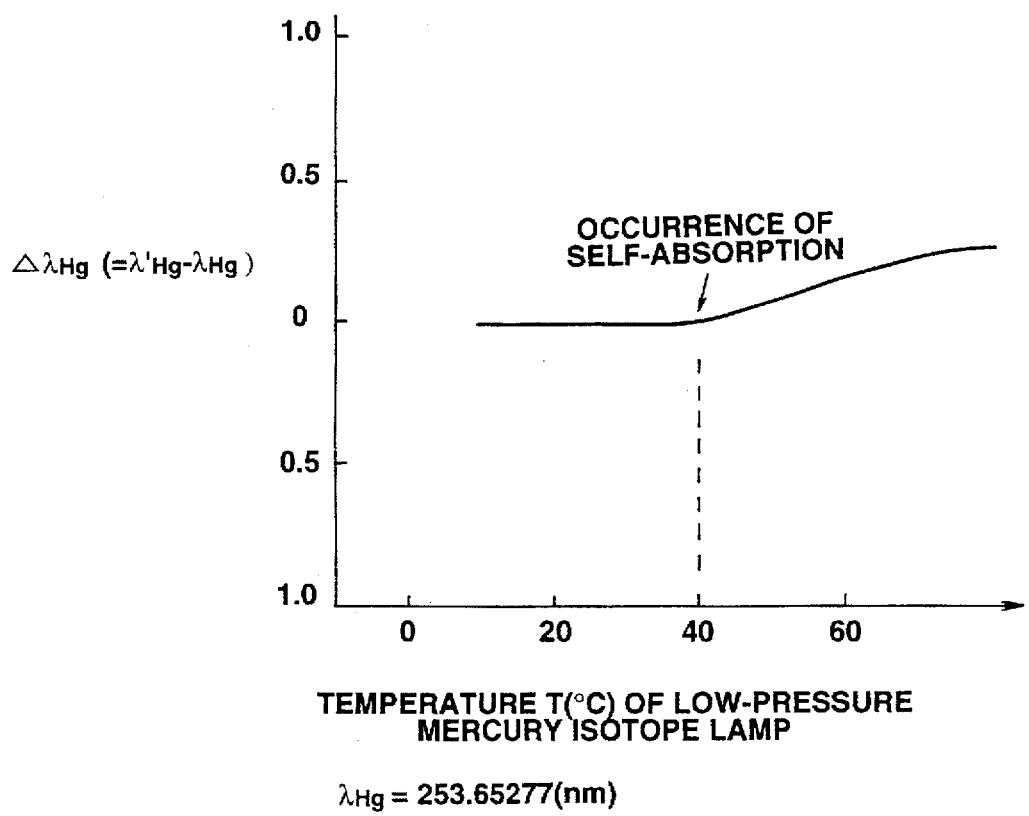
FIG. 8 is a diagram showing the relation between the wavelength of reference light and the temperature of the reference light source.

FIG. 8 shows the relationship between the surface temperature T of a low-pressure mercury lamp 7 and the difference ΔλHg between the absolute wavelength λHg' of reference light (253.7 nm line) that is detected and the theoretical absolute wavelength λHg. According to this figure, given conditions in which self-absorption does not occur, ie, when the temperature of the low-pressure mercury lamp is 40° C. or less, the difference ΔλHg is practically 0. If the surface temperature of a low-pressure mercury lamp 7 is regulated to 40° C. or less, the detected reference light wavelength does not depart from the theoretical value, and so the theoretical value can be used without modification, making it possible to omit various forms of reference light wavelength compensation calculations.

Next, low-pressure mercury lamp types will be considered.

Figure 9A:
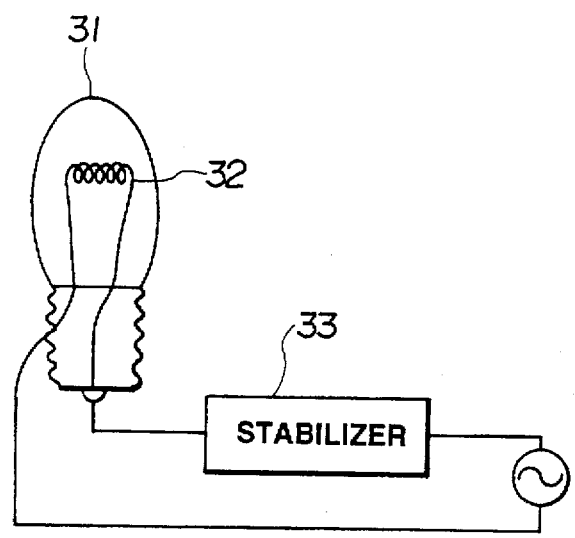
FIGS. 9(a) to 9(c) are drawings showing different types of low-pressure mercury lamps.
Figure 9B:
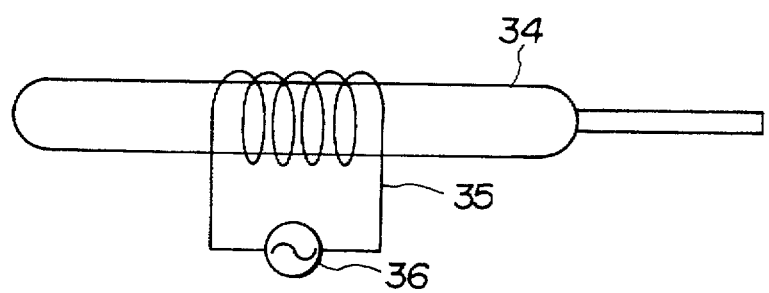
Figure 9C:
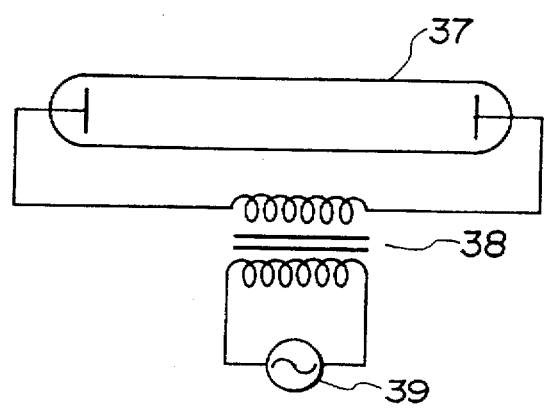

FIGS. 9(a) to 9(c) show the structures of low-pressure mercury lamps 7.

FIG. 9(a) is the case of a hot cathode type, which has a buffer gas such as argon, etc. and one type of highly pure isotopic mercury sealed in a glass (vycor glass, quartz glass, etc.) tube 31 that allows the 253.7 nm line constituting the reference light to pass. This glass tube 31, is also provided with a filament 32 which is coated with an electron emitting oxide (BaO or SrO, etc.) for emitting hot electrons. When a current is passed through this filament 32, it is heated and emits hot electrons, and the isotopic mercury is excited and emits light. A stabilizer 33 is an element keeping the current that flows in the filament 32 constant.

This hot cathode type of isotope lamp has advantages such as the following.

1. Light is emitted at a low voltage (about 30 V), and there is no need for a special power supply.
2. Lighting occurs instantaneously when current is caused to flow, and the light emission stabilizes instantaneously.
3. Since the light emission temperature is low, the spectral waveform is clear, and the linewidth is narrow (≦1 pm).
4. It is inexpensive.
5. There is no deterioration because of switch-on/switch-off.

FIG. 9(b) is the case of an electrodeless discharge tube, in which, similarly to what was described above, a buffer gas such as argon, etc. and one type of highly pure isotopic mercury are sealed in a glass (vycor glass, quartz) glass, etc.) tube 34 that allows the 253.7 nm line constituting the reference light to pass. Excitation of this lamp is effected by a high-frequency coil 35 and a high-frequency power supply 36. In the case of this lamp, 253.7 nm line reference light with a narrow spectral linewidth is produced by supplying a large amount of energy at first in order to light the lamp, and then, after the lamp is lit, reducing the energy that is supplied. This electrodeless isotope lamp has the drawback that it takes time up to stabilization of the discharge state after lighting, and that a large power supply voltage is needed for excitation.

FIG. 9(c) is the case of a cold cathode type, in which, similarly to what was described above, a buffer gas such as argon, etc. and one type of highly pure isotopic mercury are sealed in a glass (vycor glass, quartz glass, etc.) tube 37 that allows the 253.7 nm light constituting reference light to pass. Two electrodes are sealed in this glass tube 37, and discharge is brought about by applying a high voltage across the two electrodes by means of an alternating current power supply 39 and a step-up transformer 38 which makes the voltage high (several kV). In this case too, as with electrodeless discharge, a certain amount of time is needed up to stabilization after lighting. In the case of this cold electrode type too, it is possible to produce 253.7 nm line reference light which has quite a narrow spectral linewidth.

Figure 10:
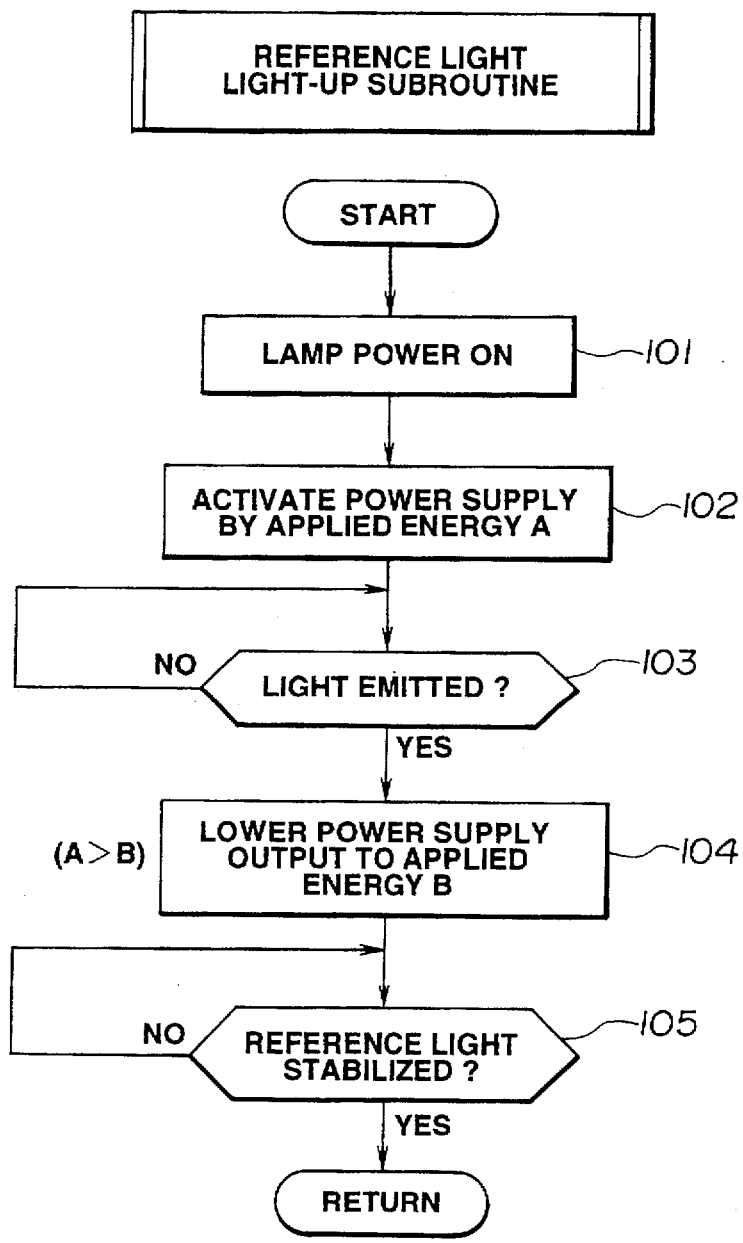
FIG. 10 is a flowchart showing an example of a low-pressure mercury lamp lighting control.

FIG. 10 shows one example of suitable lighting control for the electrodeless discharge and cold cathode type low-pressure mercury lamps 7 shown in FIGS. 9(b) and 9(c). First, the power supply of the low-pressure mercury lamp 7 is switched on (step 101), and then the power supply (the power supply 36 in the case of FIG. 9(b), and the power supply 39 in the case of FIG. 9(c)) is actuated with set supplied energy A (step 102). In the following step 103, a check is made to see if the lamp 7 has emitted light, and, after confirmation that it has, the energy supplied by the power supply is lowered to B (<A) (step 104). Finally, a check is made to see if the reference light has stabilized (step 105), and a move is made to the next routine. This control can also be applied to a hot cathode type unit.

In other words, with the reference light lighting control shown in FIG. 10, a large amount of energy is supplied initially in order to light the lamp, and, after lighting, the energy supplied is reduced, producing 253.7 nm line reference light with a narrow spectral linewidth.

As described above, when a lamp which is a low-pressure mercury isotope lamp and is a hot cathode type is used as a reference lamp, lighting takes place instantaneously when current is passed, and the emission of light stabilizes instantaneously. Further, as shown in FIG. 8 earlier, if the lamp temperature is 40° C. or less, the absolute wavelength of the reference light is constant. Therefore, if the mercury lamp is cooled, or if the reference light is detected immediately after lighting, it is possible to find the absolute wavelength of the reference light with great precision even if temperature of the reference light lamp is not detected.

Therefore, an arrangement in which the temperature sensor 14, cooling fan 15, and temperature controller 30 are omitted from the structure shown in FIG. 1, and whereby, in set cycles, the reference light is lit in a prescribed cycle its interference fringe is detected immediately (about 0.1–2 seconds), and it is then turned off. In this case, there is no need to detect the lamp's temperature.

Alternatively, an arrangement wherein only the cooling lamp 15 is installed, the temperature sensor 14 and temperature controller 30 are omitted, and the fan is turned on, the reference light is lit, and reference light interference fringe detection processing is performed in set cycles is also possible. Alternatively, such an arrangement, in which only the fan 15 is kept on permanently, is also possible.

An arrangement in which the cooling fan 15 and the reference light 7 are always on, and reference light interference fringe detection is performed periodically is also possible.

Next, a procedure for determining the absolute wavelength of reference light and the absolute wavelength of detected light will be considered.

Figure 11A:
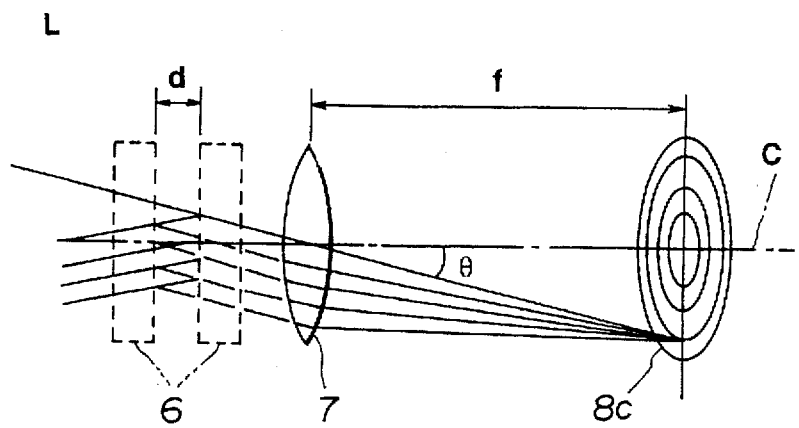
FIGS. 11(a) and 11(b) are drawings showing the principle of a monitor etalon.
Figure 11B:
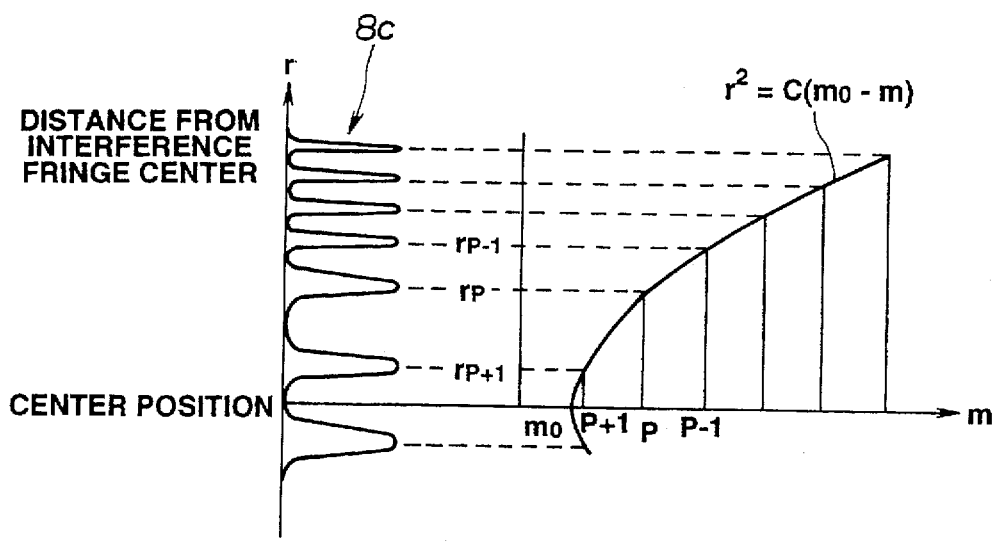

FIGS. 11(a) and 11(b) illustrate the principle of a Fabry-Perot interferometer (monitor etalon 11). As shown in 11(a), light L falls at an angle of incidence θ on an etalon 11 with a mirror gap d, and when it passes through the etalon 11 and a condensing lens 12, an interference fringe 13c of the light L is formed on the detection surface of a light detector 13 which is separated from the condensing lens 12 by the focal distance f.

As noted earlier, the basic equation for an etalon is $$m\lambda = 2nd \cdot \cos\theta \tag{1}$$

m: integer
d: etalon and partially reflecting mirror gap
n: partially reflecting mirror's refractive index
θ: angle defined by incident light and the normal to the etalon.

Designating m and the wavelength when angle θ=0 as m0 and λ0 in the above equation gives $$2nd = m0 \cdot \lambda 0 \tag{3}$$

Subtracting Eq. (1) from Eq. (3) and applying the half angle formula ($\cos\theta = 1 - 2\sin^2$) gives $$2\sin^2(\theta/2) = (\lambda/2nd)(m0-m) \tag{4}$$

^2 indicates the 2nd power.

If angle θ is a comparatively small angle, the approximation $\sin(\theta/2) = \theta/2$ can be made, and substitution of this in Eq. (4) above and ordering gives $$\theta^2 = (\lambda/nd)(m0-m) \tag{5}$$

Now, as shown in FIG. 11(b), designating the distance from the center of the interference fringe 13c as r, since the focal distance of the condensing lens 12 is f, $$r = f\theta = f(\lambda/nd)^{1/2}(m0-m)^{1/2} \tag{6}$$

^½ indicates the ½ power, ie, the square root.

Given that $c = f^2 \cdot (\lambda/nd)$, squaring both sides of Eq. (6) gives $$r^2 = c(m0-m) \tag{7}$$

(see FIG. 11(b)).

Considering the peaks p and p+1 yields the following from Eq. (7), $$c = c(mp+1 - mp) = rp^2 - rp+1^2$$

Further, in Eq. (3), using wavelength λ to differentiate the integer m gives $$-\Delta\lambda = (\lambda^2/2nd) \cdot \Delta m = FSR \cdot \Delta m \tag{9}$$

Substituting of Eq. (7) into Eq. (9) gives $$-\Delta\lambda = FSR \cdot r^2/c \tag{10}$$

and if the wavelength when m=m0 is designated as λ0, from Eq. (10) the wavelength λ that is required is given as $$\lambda = \lambda 0 - FSR \cdot r^2 \cdot c \tag{11}$$

Eq. (11) shows that the wavelength λ is proportional to the square of the radius r of the interference fringe 13c. Therefore, accurate determination of the interference fringe radius r makes it possible to determine the wavelength of the detected light accurately.

That is, in Eq. (1), the basic etalon equation noted above, designating the order corresponding to the reference light as mHg, the order corresponding to the detected light as mex, the reference light wavelength as λHg, the wavelength of the detected light as λ ex, the refractive index in the air gap of the reference light etalon 11 as nHg, and the refractive index in the air gap of the detected light etalon 11 as nex, gives the equation $$mHg \cdot \lambda Hg = 2nHg \cdot d \cdot \cos\theta \tag{12}$$

$$mex \cdot \lambda ex = 2nex \cdot d \cdot \cos\theta \tag{13}$$

If d·cosθ is then eliminated from Eqs. (12) and (13), and the equations are ordered, the wavelength λe when the reference light interference fringe and the detected light interference fringe have the same diameter leaves $$\lambda e = (nex/nHg) \cdot (mHg/mex) \cdot \lambda Hg \tag{14}$$

Therefore, designating the radius of the detected light interference fringe as rex, and the radius of the reference light interference fringe as rHg, the wavelength λex of the detected light can be determined, using Eq. (10), from the relation.

$$\lambda ex - \lambda e = FSR \cdot (rHg^2 - rex^2)/c \tag{15}$$

In this case, since the reference light and the detected light are passed through the same etalon, even if changes in the etalon's temperature, etc. occur, errors due to such changes are cancelled out, and so the absolute wavelength can be detected with high precision.

Figure 12A:
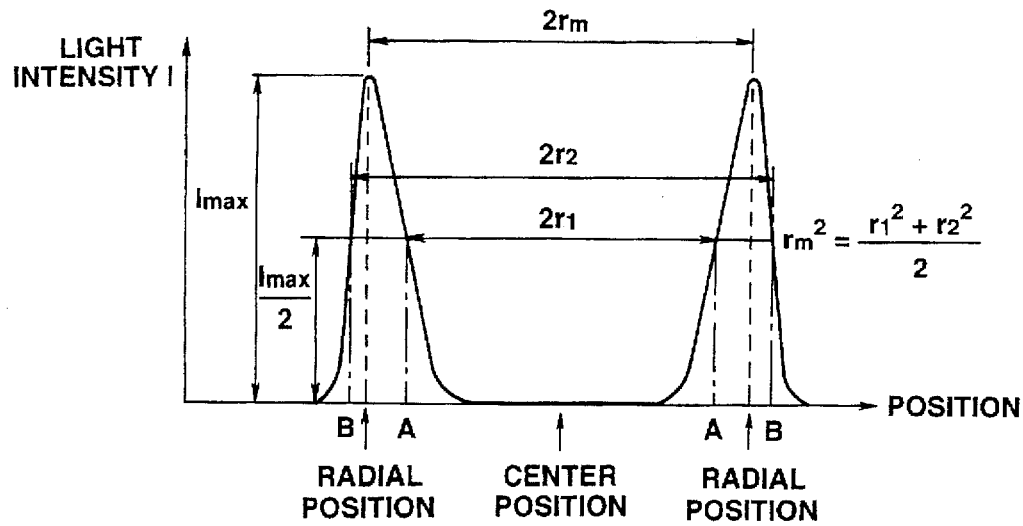
FIGS. 12(a) to 12(c) are drawings showing various procedures for determining the squares of interference fringe radii.
Figure 12B:
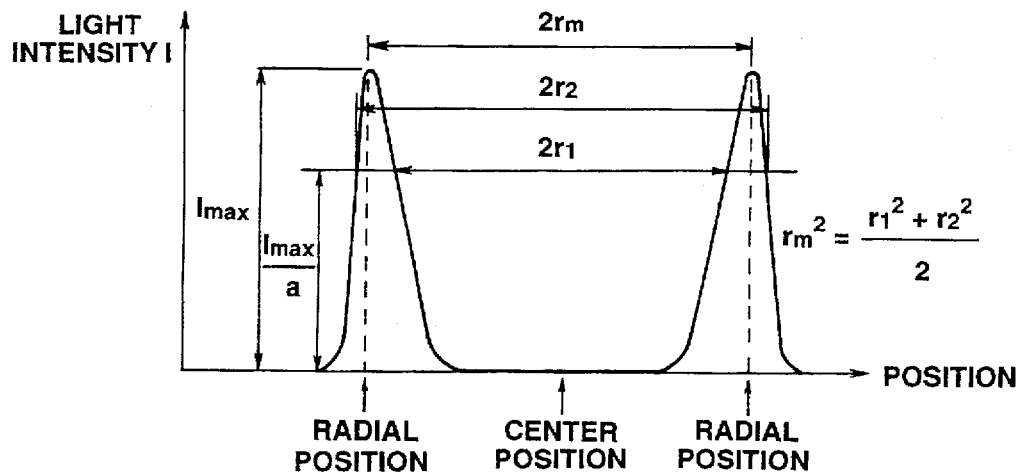
Figure 12C:
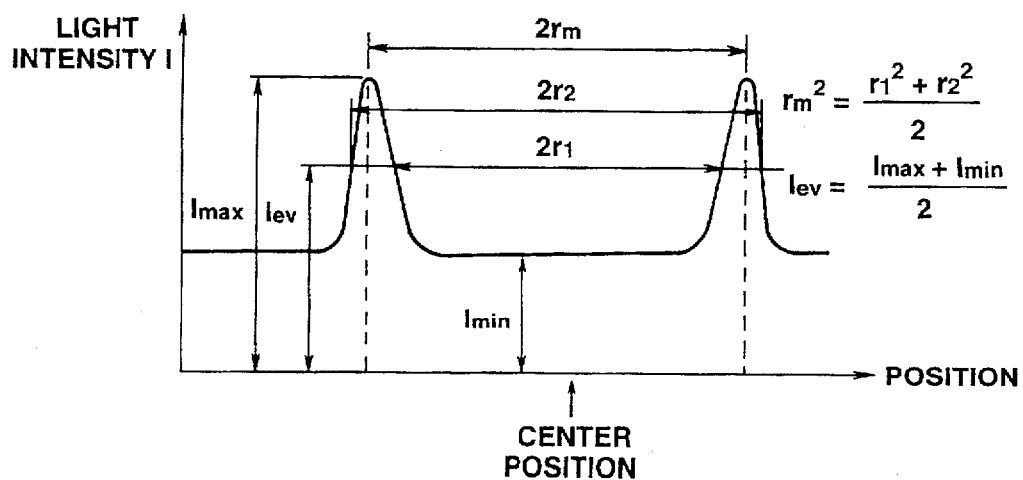

Calculation of the square $rm^2$ of a interference fringe radius is performed in the manner indicated in FIGS. 12(a) to 12(c).

That is, in the case of FIG. 12(a), the maximum value Imax of light intensity is detected, its half value Imax/2 is calculated, and an inner circle diameter 2r1 and an outer circle diameter 2r2 are determined from respective pairs of points A and B that correspond to this half value Imax/2. Then, the squares $r1^2$ and $r2^2$ of the two radii are determined from these diameters, and the square $rm^2$ of the interference fringe radius is determined from these squares, as indicated in Eq. (16).

$$rm^2 = (r1^2 + r2^2)/2 \tag{16}$$

In the case of FIG. 12(b), the radii r1 and r2 corresponding to 1/a of the maximum value Imax are determined, and the square $rm^2$ of the interference fringe radius is determined from these radii.

In the case of FIG. 12(c), the light intensity maximum value Imax and minimum value Imin are detected, their average value Iav (=(Imax+Imin)/2) is determined, and the square $rm^2$ of the interference fringe radius is determined from the radii r1 and r2 corresponding to this average value.

The procedures of 12(b) and 12(c) above are effective in the case of 253.7 nm lines when the purity P of the isotopic mercury is low.

Figure 13A:
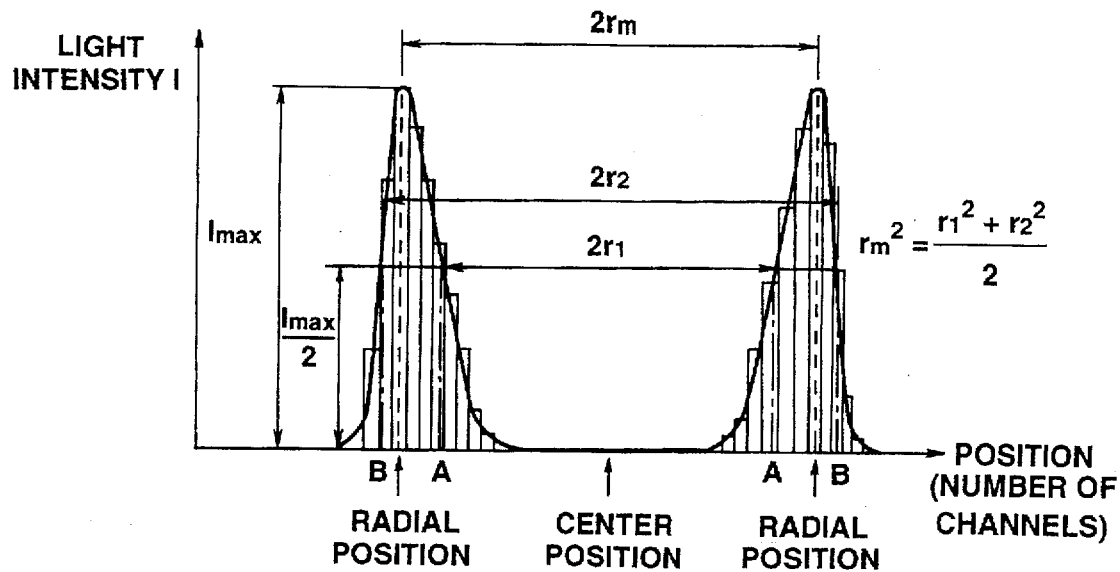
FIGS. 13(a) and 13(b) are drawings illustrating approximation calculations used in the determination of the square of interference fringe radius.
Figure 13B:
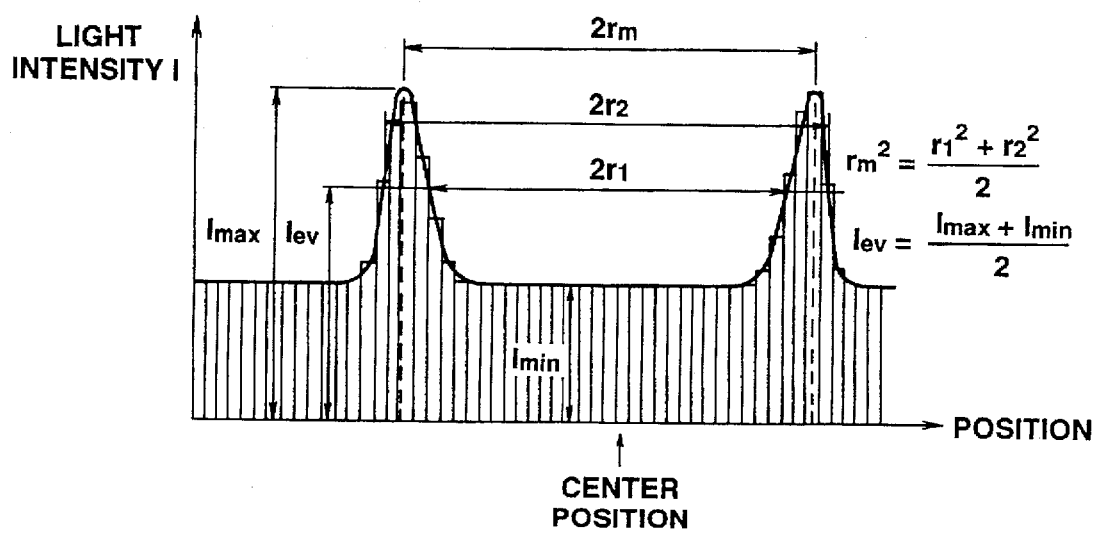

FIGS. 13(a) and 13(b) schematically show a procedure for approximation calculations when interference fringes are detected by a light detection section comprising unidimensional or two-dimensional photodiode array sensors (CCDS, etc.).

In the case of photodiode array sensors, the light quantity at each channel position is calculated. In the case of a high-resolution array, the position resolution is about 13 microns. Since, the dispersion per channel is about 0.1 pm/ch, approximation calculations are needed in order to detect changes of 0.01 pm.

FIGS. 13(a) and 13(b) show approximation curves superimposed on the signal waveforms of the various channels that have been detected by diode array sensors. The approximation curves connect the outputs between channels by straight lines and are produced by using the method of least squares or multiorder equations.

The interference fringe inner and outer radii are determined by finding the intersections of these approximation curves and, eg, the half value Imax/2, and the squares of the interference fringe radii are calculated in the manner described above. Approximation calculations such as these make it possible to detect the absolute wavelength of detected light with a resolution of 0.01 pm.

Figure 14:
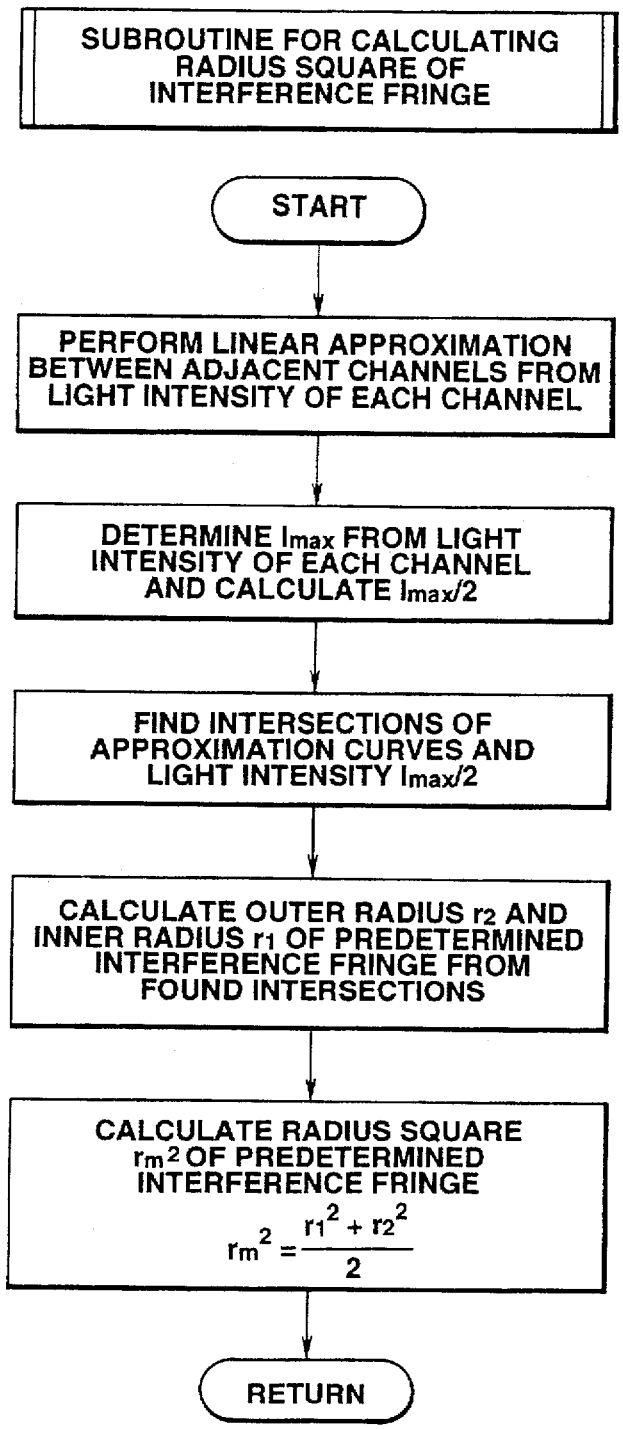
FIG. 14 is a flowchart showing one example of a procedure for determining the square of an interference fringe radius.

FIG. 14 shows one example of a method of calculating interference fringe radius squares by the abovementioned approximation calculations. In this case, first, approximation straight lines are found by joining the light quantities in the various channels by straight lines. Next, the maximum light intensity Imax among the light intensities of the various channels is found and the half value Imax/2 is calculated. Next, the intersections of the approximation straight lines and the half value Imax/2 are found, and the outer diameter r2 and the inner diameter r1 of the interference fringe are calculated from these intersections that have been found. Then, consequent to the determination of the average of these values, the square rm^2 of the interference fringe radius is calculated by Eq. (16) above.

Figure 15:
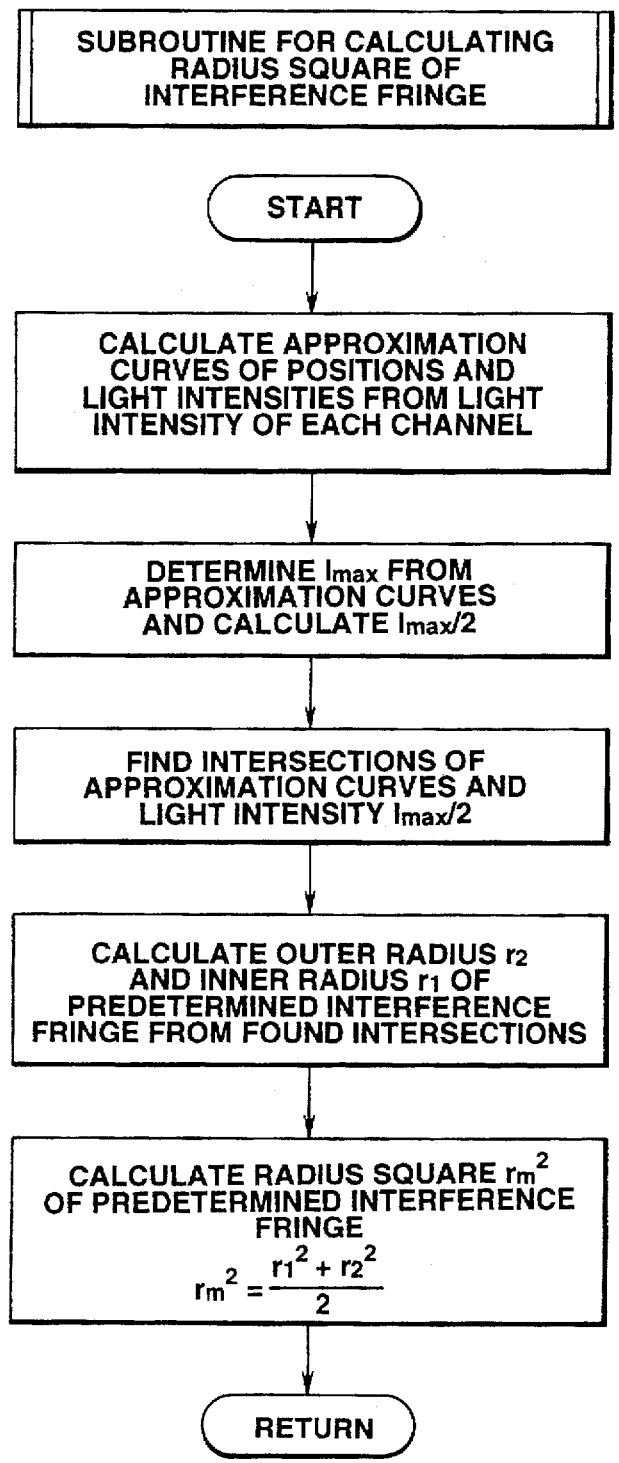
FIG. 15 is a flowchart showing one example of a procedure for determining the square of an interference fringe radius.

FIG. 15 shows another procedure for the above calculation. In this case, approximation curves are obtained not by linear approximation but by using the least squares method or a multiorder equation. The procedure after the approximation curves have been obtained is the same as that of FIG. 14 described above.

Figure 16:
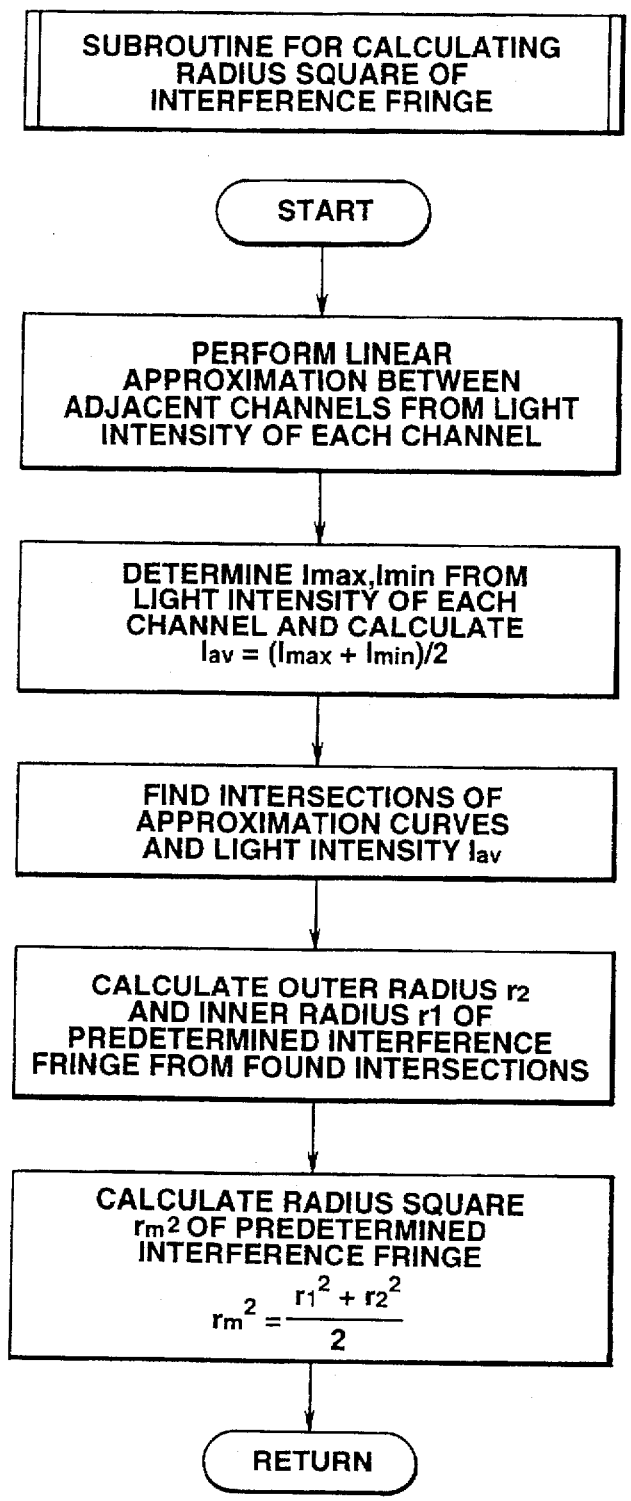
FIG. 16 is a flowchart showing one example of a procedure for determining the square of an interference fringe radius.

In FIG. 16, following linear approximation between the various channels, the light intensity maximum value Imax and minimum value Imin are detected, their average value Iav (=(Imax+Imin)/2) is determined, the intersections of this average value Iav and the approximation curves are found, the outer diameter r2 and the inner diameter r1 of the interference fringe are calculated from these intersections that have been determined, and consequent to the average of these values being determined, the square rm^2 of the interference fringe radius is calculated by Eq. (16) above.

Figure 17:
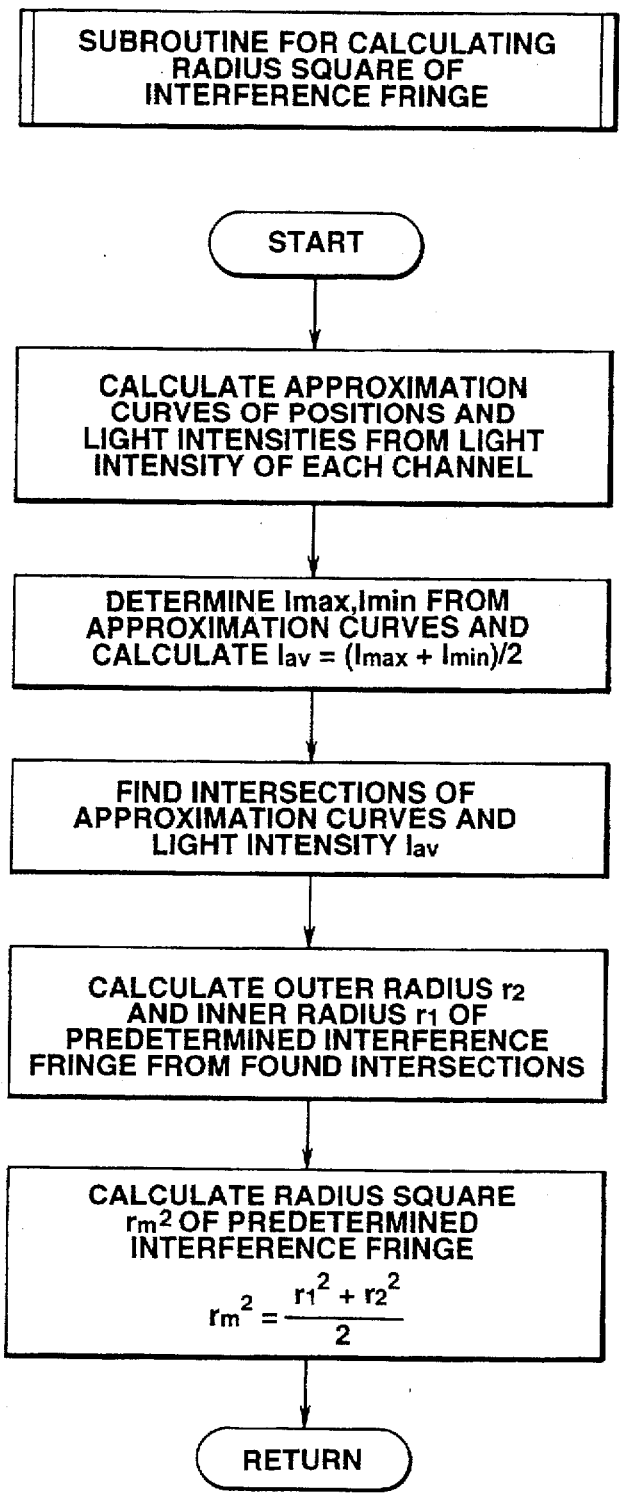
FIG. 17 is a flowchart showing one example of a procedure for determining the square of an interference fringe radius.

In FIG. 17, the procedure of FIG. 16 is performed not by linear approximation but by using approximation curves employing the method of least squares or a multiorder equation.

In the procedures described above, approximation curves are calculated from the light intensity values in the various channels, and the intersections of these approximation curves and set values such as a half value, etc. are found. However, an arrangement whereby, in a region where the relation between the number of channels and the light intensity increases monotonically, intersections such as above are determined by linear interpolation from the light intensities of a channel where the light intensity becomes greater than a set value and that of the immediately preceding channel is also possible; this reduces the calculation time.

Figure 18:
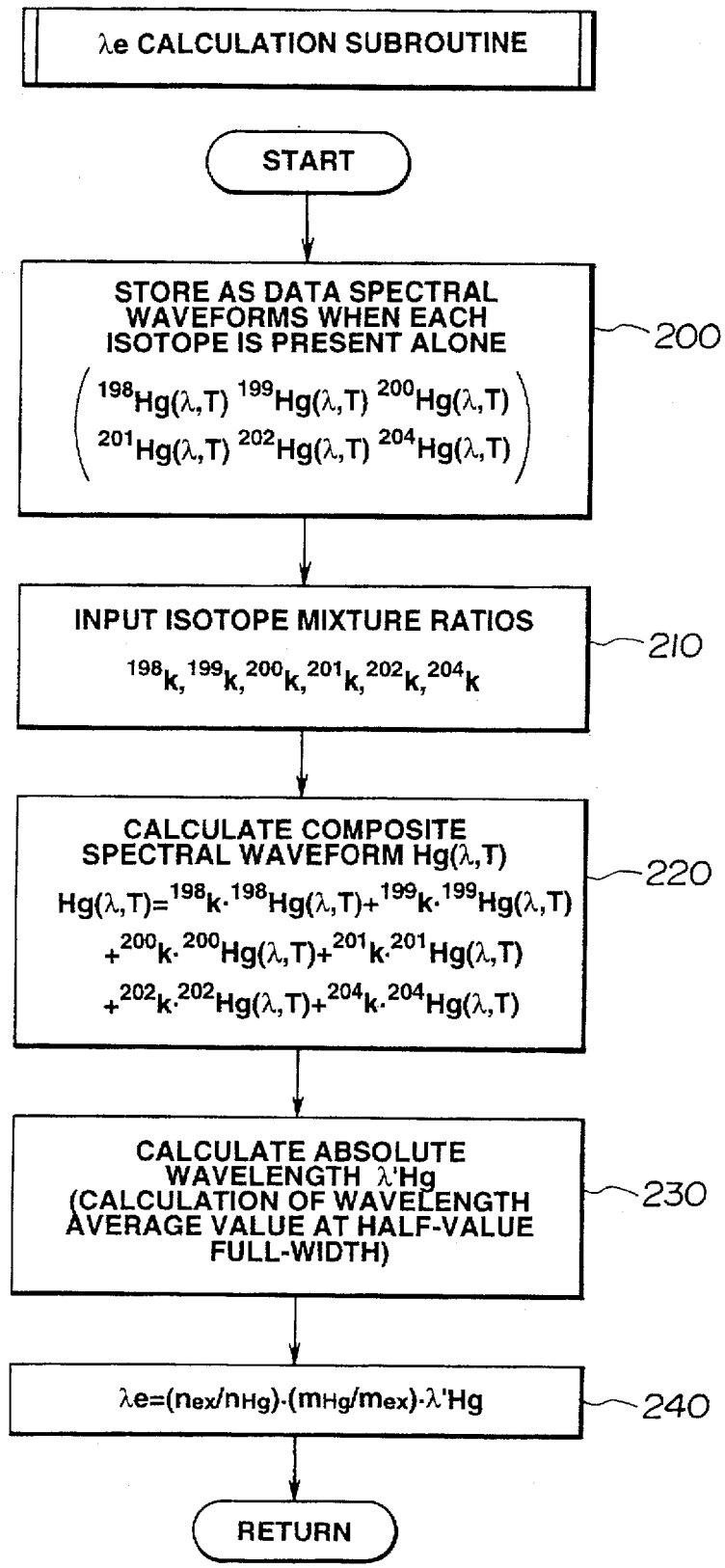
FIG. 18 is a flowchart showing procedure for determining $\lambda e$ from mercury isotope admixture ratios.

Next, a procedure for determining the absolute wavelength of reference light from mercury isotope mixture ratios will be considered with reference to the flowchart of FIG. 18.

First, the spectral waveforms for individual isotopes alone are stored as data or functions (198Hg $(\lambda, T)$, 199Hg $(\lambda, T)$, 200Hg $(\lambda, T)$, 201Hg $(\lambda, T)$, 202Hg $(\lambda, T)$ and 204Hg $(\lambda, T)$) (step 200). Next, the isotope admixture ratios (198K, 199K, 200K, 201K, 202K and 204K) and the lamp temperature T are input (step 210).

Then, these spectral waveform data and mixture ratio are used to calculate a composite spectral Hg $(\lambda, T)$ by the following formula (step 220).

$$Hg\ (\lambda, T) = 198K \cdot 198\ Hg\ (\lambda, T) + 199K \cdot 199\ Hg\ (\lambda, T) + 200K \cdot 200\ Hg\ (\lambda, T) + 201K \cdot 201\ Hg\ (\lambda, T) + 202K \cdot 202\ Hg\ (\lambda, T) + 204K \cdot 204\ Hg\ (\lambda, T) \quad (17)$$

Figure 19A:
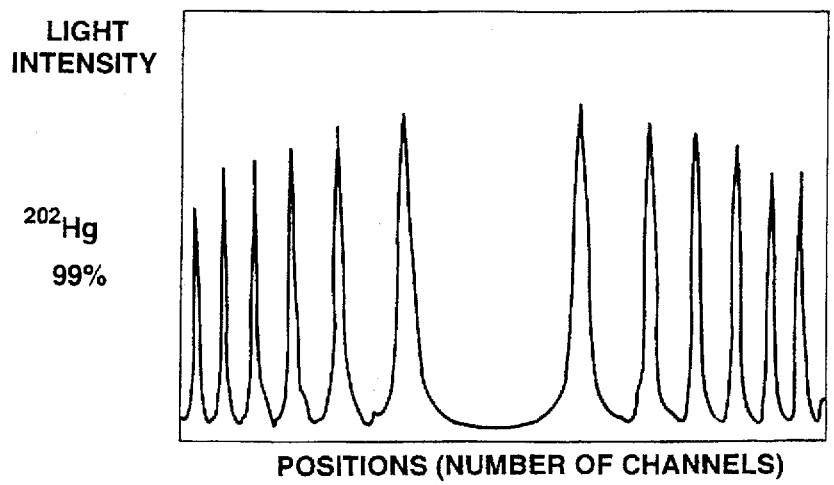
FIGS. 19(a) to 19(c) are diagrams showing the spectral waveforms of mercury with different admixture ratios.
Figure 19B:
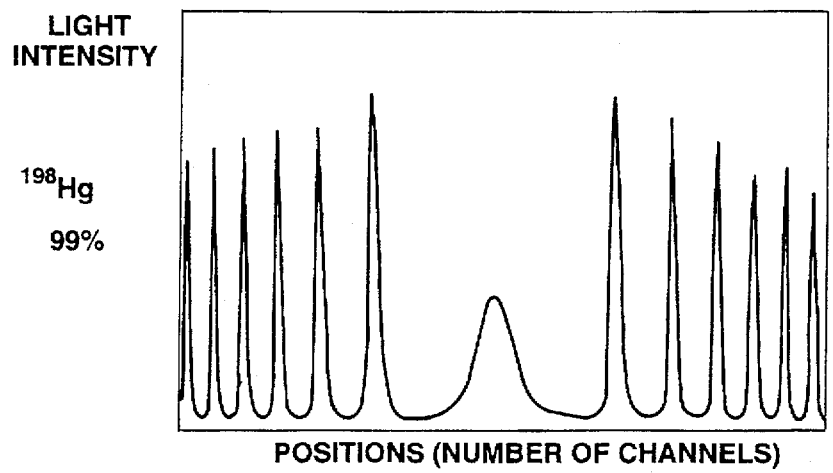
Figure 19C:
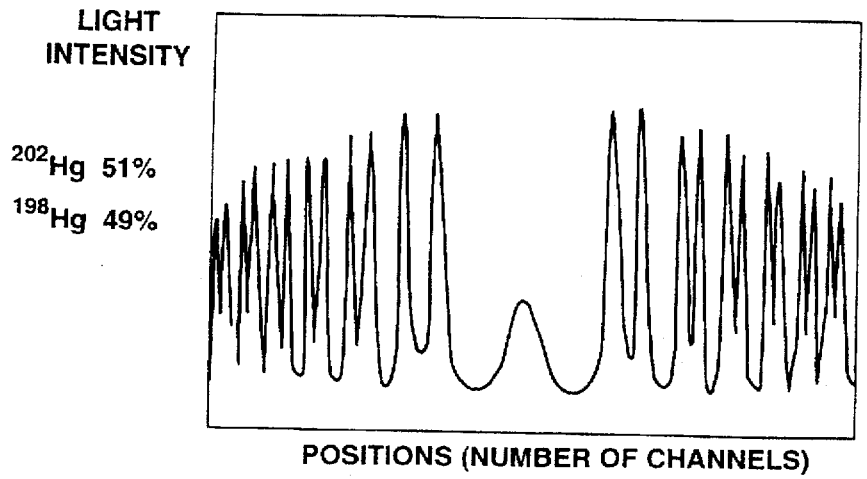

FIGS. 19(a) to 19(c) show mercury lamp spectral waveforms with different isotope mixture ratios, in which 19(a) shows the case with 99% 202Hg purity, 19(b) the case with 99% 198Hg purity, and 19(c) the case with mixed Hg consisting of 51% of 202Hg and 49% of 198Hg.

Referring to these spectral waveforms, superimposing of the spectral waveforms of 19(a) and 19(b) gives the same general waveform as that of the mixed Hg in 19(c), which demonstrates that a mixed Hg composite spectral waveform can be obtained by the calculation of Eq. (17) above.

Next, the absolute wavelength $\lambda Hg'$ of this low-pressure mercury lamp is determined from the composite spectral waveform thus determined (step 230).

The procedures of FIGS. 12(a) to 12(c) above may be used for this calculation.

In the case of the procedure illustrated in FIG. 12(a), the absolute wavelengths $\lambda Hg1$ and $\lambda Hg2$ of 2 points at the composite spectral half value are calculated, and their average value is taken to be the absolute wavelength $\lambda Hg'$ ($\lambda Hg' = (\lambda Hg1 + \lambda Hg2)/2$).

In the case of FIG. 12(b), the average value of 2 points with 1 over a (1/a) values is taken to be the absolute wavelength $\lambda Hg'$.

In the case of FIG. 12(c), the interference fringe when a composite spectral Hg $(\lambda, T)$ is produced by a monitor etalon 11 is calculated theoretically, the maximum value Imax and minimum value Imin of this interference fringe are determined, and Iav is determined from these values. Further, the wavelengths at 2 points which are at the intersections of this Iav and the composite spectral waveform Hg $(\lambda, T)$ are determined, and their average value is taken to be the absolute wavelength $\lambda Hg'$.

The absolute wavelength $\lambda Hg'$ thus determined and Eqs. (14) and (15) above are used to determine the absolute wavelength of the detected light (step 240).

Figure 20:
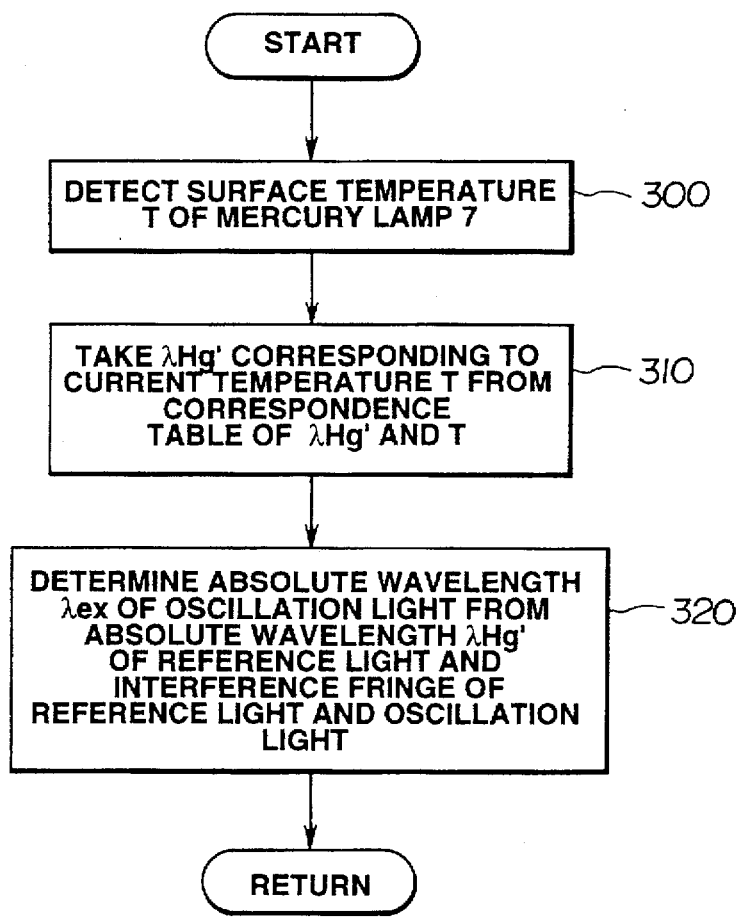
FIG. 20 is a flowchart showing procedure for determining the absolute wavelength of detected light from the reference light temperature.

Next, procedure for calculating the detected absolute wavelength $\lambda Hg'$ of reference light from the relation shown in FIG. 8 earlier between temperature T and the difference $\Delta\lambda Hg$ between the detected absolute wavelength $\lambda Hg'$ of reference light and its theoretical absolute wavelength $\lambda Hg$ is considered with reference to FIG. 20.

Since, in the relation shown in FIG. 8, the theoretical absolute wavelength $\lambda Hg$ is known (253.65277 nm), the graph of FIG. 8 can be produced as the relationship between the lamp temperature T and the reference light's detected absolute wavelength $\lambda Hg'(=\lambda Hg+\Delta\lambda Hg)$. Therefore, relationships between the lamp temperature T and the reference light's detected absolute wavelengths λHg' are stored beforehand in a set memory, eg. in table form.

To detect the wavelength of the reference light, first, the temperature T of the glass surface of the low-pressure mercury lamp 7 is detected by the temperature sensor 14 (step 300).

Next, the λHg' corresponding to the detected temperature T is read from the above correspondence table, and is taken to be the absolute wavelength of the reference light (step 310).

Next, the absolute wavelength λex of the detected light is determined by substituting into Eqs. (14) and (15) the absolute wavelength λHg' of this reference light and the radii of the reference light and detected light interference fringes detected by the light detector 13 (step 320).

Since the correct absolute wavelength of reference light can thus be obtained from the temperature of the reference light, there is no need to control the temperature of the reference light source, and it is merely necessary to detect the temperature of the lamp 7.

INDUSTRIAL APPLICABILITY

This invention is useful for applications in narrow-band excimer lasers serving as light sources for semiconductor exposure devices.

We claim:

1. A wavelength detector in which a reference light emitted from a reference light source using a low-pressure mercury lamp having an oscillation wavelength of 253.7 nm and a sample light are made incident, and an absolute wavelength of the sample light is determined on the basis of the incident lights, characterized in that a specific isotope of mercury having a purity of at least 49% is sealed in the low-pressure mercury lamp used as the reference light source and said mercury lamp is operated so as not to exceed a surface temperature of 40° C.

2. An excimer laser wavelength detector in which a low-pressure mercury lamp is used as a reference light source, a reference light emitted from the reference light source and a laser oscillation light are made incident on a wavelength detecting unit and an absolute wavelength of the laser oscillation light is determined on the basis of a detection output of the wavelength detecting unit, characterized by comprising:

temperature control means for controlling a surface temperature of the low-pressure mercury lamp so as to not exceed a prescribed temperature of 40° C.

3. An excimer laser wavelength detector in which a reference light produced by a reference light source and a laser oscillation light are made incident on a wavelength detecting unit and an absolute wavelength of the laser oscillation light is determined on the basis of a detection output of the wavelength detecting unit, characterized by comprising:

temperature detection means for detecting a surface temperature of the reference light source;

memory means in which a relationship between an absolute wavelength of the reference light and the surface temperature of the reference light source are set beforehand; and oscillation light wavelength calculation means for reading out from the memory means the absolute wavelength of the reference light corresponding to a temperature detected by the temperature detection means, and determining the absolute wavelength of the oscillation light on the basis of the absolute wavelength of the reference light which has been read out and the output of the wavelength detecting unit.

4. An excimer laser wavelength detector in which a low-pressure mercury lamp is used as a reference light source, a reference light emitted from the reference light source and a laser oscillation light are made incident on a wavelength detecting unit and an absolute wavelength of the laser oscillation light is determined on the basis of a detection output of the wavelength detecting unit, characterized by comprising:

memory means for storing respective spectral waveforms of mercury isotopes which are sealed in the low-pressure mercury lamp;

waveform synthesis means for determining a spectral waveform of the reference light emitted from the low-pressure mercury lamp, by synthesizing the stored mercury isotope spectral waveforms in accordance with a mixture ratio of the mercury isotopes; and wavelength calculation means for determining an absolute wavelength of the reference light from a spectral waveform of the reference light and calculating the absolute wavelength of the laser oscillation light on the basis of the determined absolute wavelength of the laser oscillation light.

5. A wavelength detector in which a reference light emitted from a reference light source using a low-pressure mercury lamp and a sample light are made incident and an absolute wavelength of the sample light is determined on the basis of the incidents lights, characterized in that an electrodeless discharge type or a cold cathode type is used as the low-pressure mercury lamp, and the wavelength detector comprises:

power supply control means for effecting lighting of the low-pressure mercury lamp by initially actuating a power supply at high energy and for lowering the energy supplied by the power supply when the lighting has been confirmed.

6. An excimer laser wavelength detector in which a reference light emitted from a reference light source and a laser oscillation light are made incident, via wavelength selection elements, on a light detection element array in which a plurality of light detection elements are arrayed and an absolute wavelength of the laser oscillation light is determined on the basis of detection outputs of the light detection elements of the light detection element array, characterized by comprising:

spectral waveform approximation calculation means for calculating approximate spectral waveforms of the reference light and the laser oscillation light by applying a predetermined approximation process to detection outputs of the light detection elements of the light detection element array; and wavelength calculation means for calculating radii of interference fringes of the reference light and the laser oscillation light from approximate spectral waveforms, and for calculating the absolute wavelength of the laser oscillation light from the interference fringe radii which have been determined.

7. A mercury lamp used as a reference light source for a wavelength detector, wherein a reference light emitted from the reference light source and a light to be detected are made incident, and an absolute wavelength of the light to be detected is determined on the basis of the incident lights, characterized in that a specific isotope of mercury having a purity of 49% or more is sealed in the mercury lamp and said mercury lamp is operated so as not to exceed a surface temperature of 40° C.

8. A mercury lamp used as a reference light source for a wavelength detector, wherein a reference light emitted from the reference light source and a light to be detected are made incident on the wavelength detector, and an absolute wavelength of the light to be detected is determined on the basis of a detection output of the wavelength detector, characterized in that a specific isotope of mercury having a purity of 49% or more is sealed in said mercury lamp, and said mercury lamp is operated so as not to exceed a surface temperature of 40° C.

9. A wavelength detector in which a low-pressure mercy lamp is used as a reference light source, a reference light emitted from the reference light source and a laser oscillation light are made incident on a wavelength detecting unit, and an absolute wavelength of the laser oscillation light is determined on the basis of a detection output of the wavelength detecting unit, characterized in that a 253.7 nm line emitted from said mercury lamp, in which the mercury therein is contains 49% or more of a specific isotope of mercury, is used as the reference light, and a temperature control means is used to control the surface temperature of said mercury lamp so as not to exceed 40° C.

10. A wavelength detector in which a reference light emitted from a reference light source having an oscillation wavelength of 253.7 nm and a light whose oscillation wavelength is to be detected are made incident, and an absolute wavelength of the light to be detected is determined on the basis of the incident lights, characterized in that 49% or more of an isotope mercury having a mass number of 202 is sealed in the low-pressure mercury lamp used as the reference light source, and said mercury lamp is operated so as not to exceed a surface temperature of 40° C.

11. A wavelength detector in which a reference light emitted from a reference light source using a low-pressure mercury lamp and a light whose oscillation wavelength is to be detected are made incident, and an absolute wavelength of the light to be detected is determined on the basis of the incident lights, characterized in that an electrodeless discharge type of mercury lamp is used as the low-pressure mercury lamp in which a kind of isotope of mercury is sealed, said wavelength detector comprising:

power supply control means for effecting lighting of the low-pressure lamp by initially actuating a power supply at high energy and for lowering the energy supplied by the power supply when the lighting has been confirmed.

12. A wavelength detecting unit for detecting a wavelength of a sample light source, comprising:

a wavelength detector;

a reference light source using a low-pressure mercury lamp having an oscillation wavelength of 253.7 nm, said mercury lamp containing a specific isotope of mercury having a purity of at least 49%, said mercury lamp being operated so as not to exceed a surface temperature of 40° C.;

wherein a reference light emitted from said reference light source and the light to be detected are made incident on said wavelength detector, and an absolute wavelength of the light to be detected is determined on the basis of the incident lights.

13. A wavelength detecting unit for detecting a wavelength of a sample light source, comprising:

a wavelength detector;

a reference light source using a low-pressure mercury lamp of one of a cold cathode type and an electrodeless discharge type, said mercury lamp containing a specific isotope of mercury having a purity of at least 49%;

wherein a reference light emitted from said reference light source and the light to be detected are made incident on said wavelength detector, and an absolute wavelength of the light to be detected is determined on the basis of the incident lights;

wherein said wavelength detector includes a power supply control means for effecting lighting of said mercury lamp by initially actuating a power supply at high energy and for lowering the energy supplied by said power supply when light emission from said mercury lamp has been confirmed.

\* \* \* \* \*